United States Patent
Sugino et al.

(10) Patent No.: US 8,629,556 B2
(45) Date of Patent: Jan. 14, 2014

(54) SEMICONDUCTOR DEVICE

(75) Inventors: Mitsuo Sugino, Tokyo (JP); Takeshi Hosomi, Tokyo (JP); Masahiro Wada, Tokyo (JP); Masataka Arai, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 989 days.

(21) Appl. No.: 11/885,404

(22) PCT Filed: Apr. 20, 2007

(86) PCT No.: PCT/JP2007/000436
§ 371 (c)(1),
(2), (4) Date: Jul. 27, 2009

(87) PCT Pub. No.: WO2007/122821
PCT Pub. Date: Nov. 1, 2007

(65) Prior Publication Data
US 2009/0321919 A1    Dec. 31, 2009

(30) Foreign Application Priority Data
Apr. 20, 2006 (JP) .............. P2006-117146

(51) Int. Cl.
*H01L 23/48* (2006.01)
*H01L 23/52* (2006.01)
*H01L 29/40* (2006.01)

(52) U.S. Cl.
USPC ........... 257/737; 257/700; 257/738; 257/778; 257/779; 257/E23.007; 257/E23.009; 257/E21.011; 257/E23.069; 438/106; 438/108; 438/622; 438/623; 174/250; 174/255; 174/256; 174/258; 174/261

(58) Field of Classification Search
USPC .......... 257/700, 778, 737, 738, 779, 257/E23.007–E23.009, E23.011, E23.038, 257/E23.069; 438/106, 108, 118, 622–623; 174/250, 255, 256, 258, 261–263
See application file for complete search history.

(56) References Cited

U.S. PATENT DOCUMENTS 5,962,925 A * 10/1999 Eifuku et al. .................. 257/778
6,332,988 B1 * 12/2001 Berger et al. .................. 216/100
(Continued)

FOREIGN PATENT DOCUMENTS

| JP | 9-64236 | 3/1997 |
| JP | 10-335389 | 12/1998 |

(Continued)

OTHER PUBLICATIONS

Chinese Office Action issued on Sep. 18, 2009 for application No. 2007800072296.

*Primary Examiner* — Meiya Li
(74) *Attorney, Agent, or Firm* — Smith, Gambrell & Russell, LLP

(57) ABSTRACT

The semiconductor device 1 includes a substrate 3, a semiconductor chip 4 mounted on the substrate 3, the substrate 3, a bump 5 connecting the substrate 3 and the semiconductor chip 4, and an underfill 6 filling in around the bump 5. In the case of a bump 5 composed of a high-melting-point solder having a melting point of 230° C. or more, the underfill 6 is composed of a resin material having an elastic modulus in the range of 30 MPa to 3000 MPa. In the case of a bump 5 composed of a lead-free solder, the underfill 6 is composed of a resin material having an elastic modulus in the range of 150 MPa to 800 MPa. An insulating layer 311 of buildup layers 31 of the substrate 3 has a linear expansion coefficient of 35 ppm/° C. or less in the in-plane direction of the substrate at temperatures in the range of 25° C. to the glass transition temperature.

14 Claims, 4 Drawing Sheets

(56) References Cited

U.S. PATENT DOCUMENTS

| | | |
|---|---|---|
| 6,333,206 B1 | 12/2001 | Ito et al. |
| 6,448,665 B1 | 9/2002 | Nakazawa et al. |
| 7,067,922 B2 | 6/2006 | Hasunuma et al. |
| 2003/0136577 A1 | 7/2003 | Abe |
| 2004/0222522 A1 | 11/2004 | Homma |
| 2005/0106370 A1* | 5/2005 | Takai et al. ............ 428/209 |
| 2007/0087479 A1* | 4/2007 | Lu et al. ............ 438/108 |
| 2007/0137887 A1 | 6/2007 | Watanabe et al. |

FOREIGN PATENT DOCUMENTS

| | | |
|---|---|---|
| JP | 11-220077 | 8/1999 |
| JP | 11-233571 | 8/1999 |
| JP | 2003-105054 | 4/2003 |
| JP | 2003-273482 | 9/2003 |
| JP | 2004-277671 | 10/2004 |
| JP | 2004-281491 | 10/2004 |
| JP | 3726318 | 10/2005 |
| TW | I238460 B | 8/2005 |
| WO | 2005/048348 | 5/2005 |

* cited by examiner

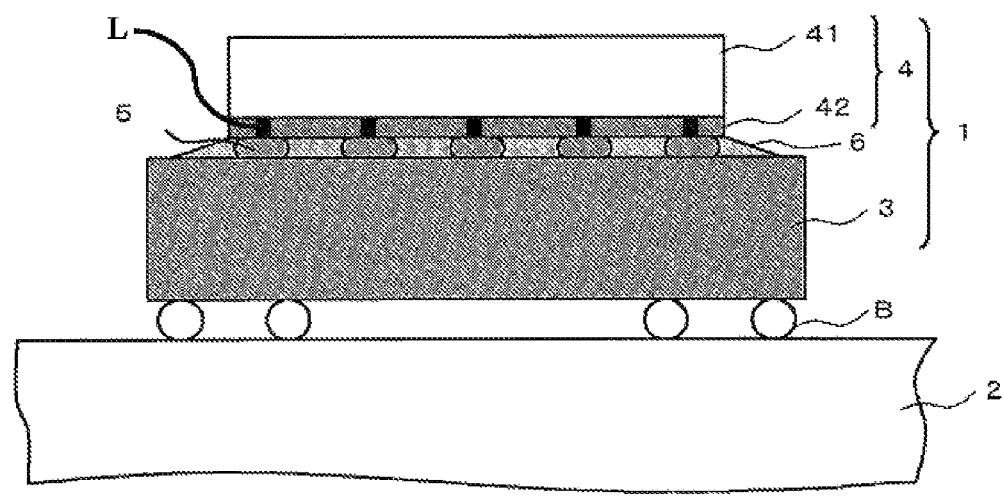
Fig.1
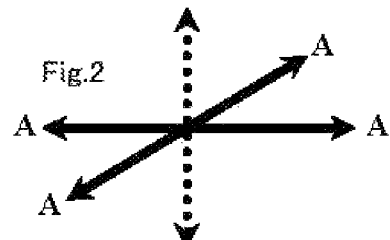
Fig.2
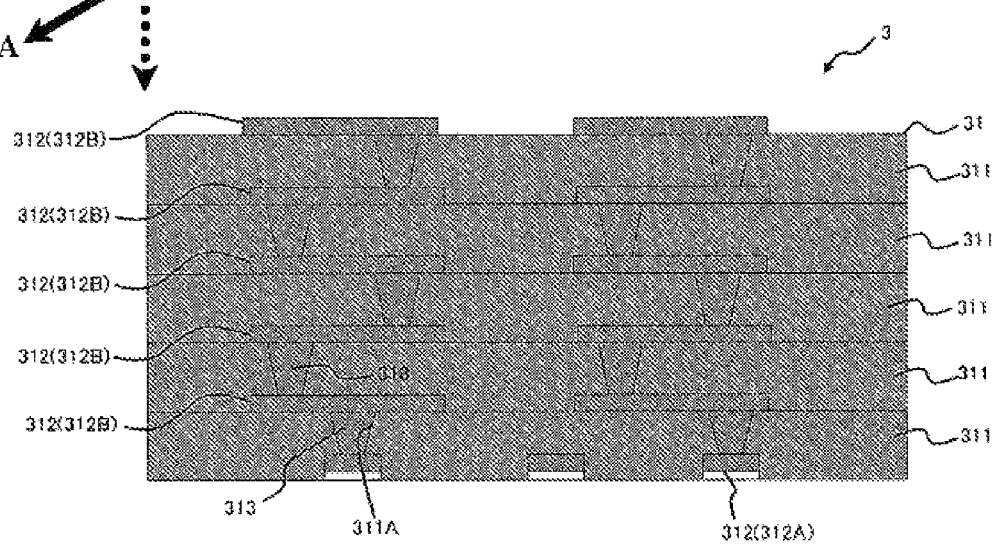

SEMICONDUCTOR DEVICE

TECHNICAL FIELD

The present invention relates to a semiconductor device.

BACKGROUND ART

In face-down mounting of a semiconductor chip (semiconductor element) on a substrate, an undesirable gap is formed between the substrate and the semiconductor chip. The gap must be filled with an insulating material called underfill. Thermosetting resins such as epoxy resins have been widely used as materials for the underfill (Patent Document 1).

[Patent Document 1] Japanese Unexamined Patent Application Publication No. H11-233571

DISCLOSURE OF INVENTION

In general, substrates and semiconductor chips have different linear expansion coefficients. The substrates, composed of materials containing organic resins, have linear expansion coefficients larger than that of the semiconductor chips. When a semiconductor device including a semiconductor chip mounted on a substrate undergoes thermal history, the substrate warps due to a difference in linear expansion coefficient between them. In a conventional semiconductor device, such warpage would cause damage such as cracks in the semiconductor chip, at the interface between the semiconductor chip and a bump, and at the interface between the bump and the substrate, in some cases.

Furthermore, substrates having buildup layers have been used in recent years. Conventional models of such substrates include buildup layers on core layers. With rapid shift towards higher clock frequencies of semiconductor chips, substrates that can reduce inductance are required for mounting semiconductor chips. A substrate having core layers and buildup layers has significantly high inductance at through holes in the core layer. Proposed solutions to reduce inductance are a reduction in thickness of the core layer as much as possible or use of a substrate having only buildup layers (without core layers).

In general, the core layer is provided to reduce the linear expansion coefficient of the substrate. Thus, a reduction in thickness of the core layer or use of a substrate having only buildup layers accelerates warping of the substrate by thermal history.

An object of the present invention is to provide a semiconductor device that can prevent occurrence of damage in a semiconductor element, at the interface between the semiconductor element and a bump, and at the interface between the bump and a substrate.

According to the present invention, there is provided a semiconductor device comprising:
a substrate;
a semiconductor element mounted on the substrate;
a bump connecting the substrate and the semiconductor element; and
an underfill filling in around the bump,
wherein the bump comprises a high-melting-point solder having a melting point of 230° C. or more,
the underfill comprises a resin material having an elastic modulus in the range of 30 MPa to 3000 MPa,
the substrate has buildup layers including resin-containing insulating layers and conductive interconnection layers that are alternately laminated, each of the conductive interconnection layers being connected by conductive layers formed in via holes in the insulating layers, and
the linear expansion coefficient of the insulating layer of the buildup layer in the in-plane direction of the substrate at temperatures between 25° C. and the glass transition temperature is 35 ppm/° C. or less.

According to the invention having such a configuration, the elastic modulus of the underfill is controlled to 30 MPa or more and 3000 MPa or less to tightly fix the periphery of the bump and to prevent occurrence of cracks in the bump. Since the linear expansion coefficient of the insulating layer of the buildup layer in the in-plane direction of the substrate at temperatures between 25° C. and the glass transition temperature is 35 ppm/° C. or less, warping of the buildup layer can be moderated, resulting in effective suppression of damage of the semiconductor element, damage at the interface between the semiconductor element and the bump, and damage at the interface between the bump and the substrate.

Herein, the elastic modulus of the underfill is determined from a stress-strain curve measured at 125° C.

According to the present invention, there is also provided a semiconductor device comprising:
a substrate;
a semiconductor element mounted on the substrate;
a bump connecting the substrate and the semiconductor element; and an underfill filling in around the bump,
wherein the bump comprises a lead-free solder,
the underfill comprises a resin material having an elastic modulus in the range of 150 MPa to 800 MPa,
the substrate has buildup layers including resin-containing insulating layers and conductive interconnection layers that are alternately laminated, these conductive interconnection layers being connected by conductive layers formed in via holes in the insulating layers, and
the linear expansion coefficient of the insulating layer of the buildup layer in the in-plane direction of the substrate at temperatures between 25° C. and the glass transition temperature is 35 ppm/° C. or less.

According to the invention having such a configuration, the elastic modulus of the underfill is controlled to 150 MPa or more and 800 MPa or less to prevent occurrence of cracks in the bump even when a bump composed of a lead-free solder having relatively low toughness is used. Since the linear expansion coefficient of the insulating layer of the buildup layer in the in-plane direction of the substrate at temperatures between 25° C. and the glass transition temperature is 35 ppm/° C. or less, warping of the buildup layer can be moderated, resulting in effective suppression of damage of the semiconductor element, damage at the interface between the semiconductor element and the bump, and damage at the interface between the bump and the substrate.

Herein, the elastic modulus of the underfill is determined from a stress-strain curve measured at 125° C.

According to the semiconductor device of the present invention, preferably, the semiconductor element includes a silicon substrate, an interlayer insulating film provided on the silicon substrate, the interlayer insulating film including a low-dielectric layer having a relative permittivity of 3.3 or less, and a lead L provided in the interlayer insulating film.

The semiconductor device according to the present invention can prevent occurrence of cracks in the bump and damage of the semiconductor element.

Thus, a semiconductor element having a low-dielectric layer having a relative dielectric constant of 3.3 or less (low-k film) can also prevent damage of the low-k film of the semiconductor element.

Preferably, the difference in linear expansion coefficient between the underfill and the insulating layer of the buildup layer at temperatures between 25° C. and the glass transition temperature is 25 ppm/° C. or less.

Controlling the difference in linear expansion coefficient between the underfill and the insulating layer of the buildup layer at temperatures between 25° C. and the glass transition temperature to 25 ppm/° C. or less can suppress distortion generated between the underfill and the substrate.

Preferably, the difference in linear expansion coefficient between the underfill and the bump at temperatures between 25° C. and the glass transition temperature is 10 ppm/° C. or less.

Controlling the difference in linear expansion coefficient between the underfill and the bump at temperatures between 25° C. and the glass transition temperature to 10 ppm/° C. or less can suppress distortion generated between the underfill and the bump.

The substrate may have a through hole in which a conductive layer is provided inside an insulating layer, the conductive layer in the through hole having a core layer connected to one of the conductive interconnection layers of the buildup layer.

The substrate may have no core layer.

Preferably, the resin of the insulating layer of the buildup layer comprises a cyanate resin, and more preferably, the cyanate resin is a novolak cyanate resin.

The resin of the insulating layer containing the cyanate resin, particularly the novolak cyanate resin allows the insulating layer to have a linear expansion coefficient of 35 ppm/° C. or less in the in-plane direction of the substrate at temperatures between 25° C. and the glass transition temperature. Also, the resin of the insulating layer containing the cyanate resin, particularly, the novolak cyanate resin enables the linear expansion coefficient in the thickness direction of the substrate to decrease.

The semiconductor device according to the present invention can prevent occurrence of damage in the semiconductor element, at the interface between the semiconductor element and the bump, and at the interface between the bump and the substrate

BRIEF DESCRIPTION OF THE DRAWINGS

The object described above and other objects, features, and advantages will be further clarified by preferred embodiments described below and the accompanying drawings.

FIG. 1 is a schematic view of a semiconductor device in accordance with the present invention.

FIG. 2 is a cross-sectional view of a substrate.

BEST MODE FOR CARRYING OUT THE INVENTION

Figure 3:
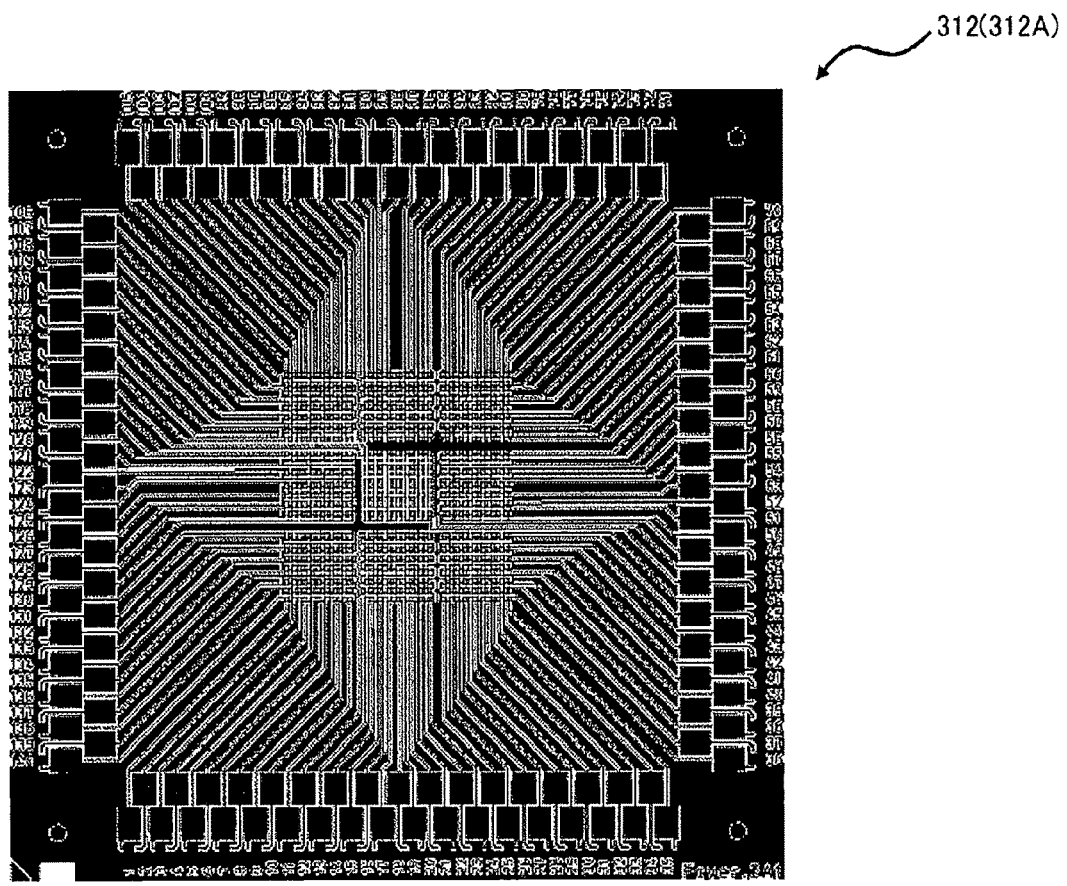
FIG. 3 is a plan view of a conductive interconnection layer of a substrate.

The embodiments of the present invention are now described with reference to the drawings.

With reference to FIG. 1, the outline of a semiconductor device 1 according to the embodiment will be described.

The semiconductor device 1 includes a substrate 3, a semiconductor element (semiconductor chip) 4 mounted on the substrate 3, a substrate 3, bumps 5 connecting the substrate 3 and the semiconductor chip 4, and an underfill 6 filling in around the bumps 5.

In the case of use of bumps 5 composed of a high-melting-point solder having a melting point of 230° C. or more (for example, a tin/lead solder alloy having a lead content exceeding 85 wt %), the underfill 6 comprises a resin material having an elastic modulus in the range of 30 MPa to 3000 MPa.

In the case of use of bumps 5 composed of a lead-free solder, the underfill 6 comprises a resin material having an elastic modulus in the range of 150 MPa to 800 MPa.

With reference to FIG. 2, the substrate 3 includes buildup layers 31 including resin-containing insulating layers 311 and conductive interconnection layers (conductive wiring layers) 312 that are alternately laminated, these conductive interconnection layers 311 being connected by conductive layers 313 formed in via holes 311A in the insulating layers 311.

The linear expansion coefficient of the insulating layers 311 of the buildup layer 31 in the in-plane direction of the substrate at temperatures between 25° C. and the glass transition temperature is 35 ppm/° C. or less.

[Substrate]

The substrate 3 is now described.

The substrate 3 is used for flip-chip mounting of the semiconductor chip 4.

With reference to FIG. 2, the substrate 3 is a so-called a buildup substrate that includes buildup layers 31 including resin-containing insulating layers 311 and conductive interconnection layers 312 that are alternately laminated. For example, in this embodiment, the buildup layer 31 includes five insulating layers 311 and six conductive interconnection layers 312 that are alternately laminated. This substrate 3 has no core layer.

This substrate 3 is a BGA substrate, which is mounted on a printed-wiring board (mother board) 2 with bumps B (see FIG. 1). The substrate 3 has a thickness of preferably 800 μm or less and more preferably 500 μm or less.

The insulating layers 311 is composed of only a resin composition, but not prepreg prepared by impregnating fabrics or unidirectionally oriented fabrics of carbon or glass fiber with a variety of resins. Accordingly, the insulating layers 311 are not reinforced by fiber, such as carbon fiber or glass fiber.

Examples of resins for the insulating layers 311 include epoxy resins, bismaleimide-triazine (BT) resins, and cyanate resins. Among these preferred are cyanate resins. Examples of the cyanate resins include novolak cyanate resins, bisphenol A cyanate resins, bisphenol E cyanate resins, and tetramethylbisphenol F cyanate resins. The use of novolak cyanate resins is particularly preferred.

The usable novolak cyanate resins are represented by the following chemical formula (In the formula, n denotes an integer):

(Chem. 1)

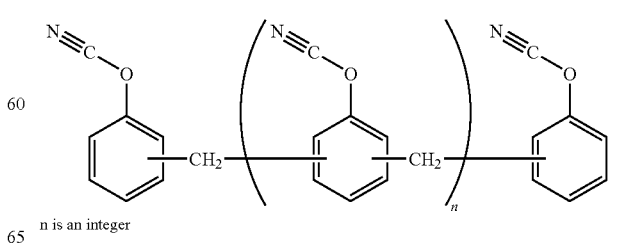

(I)

n is an integer

Such novolak cyanate resins can be prepared by the reaction of, for example, novolak-type phenols with compounds such as cyanogen chloride or cyanogen bromide.

The novolak cyanate resin has a weight average molecular weight in the range of preferably 500 to 4500 and more preferably 600 to 3000.

A weight average molecular weight of less than 500 may cause a decrease in mechanical strength. A weight average molecular weight exceeding 4500 may cause an increase in curing rate of the resin composition, resulting in low storage stability.

The cyanate resins may also be used in the form of prepolymers. These cyanate resins and prepolymers may be used alone or in combination. The prepolymers are generally prepared by trimerization of the cyanate resins through, for example, a thermal reaction. Any prepolymer may be used. For example, the trimer content in the usable prepolymer is in the range of 20 weight percent to 50 weight percent. The trimer content can be determined with, for example, an infrared spectrophotometer.

The content of the cyanate resin is not limited, and is in the range of preferably 5 weight percent to 50 weight percent and more preferably 10 weight percent to 40 weight percent of the overall resin composition of the insulating layers 311. A cyanate resin content of 5 weight percent or more contributes to an enhancement in thermal resistance. A cyanate resin content of 50 weight percent or less can maintain high moisture resistance.

The cyanate resin may contain an epoxy resin and a phenoxy resin, for example. Epoxy resins having biphenylalkylene skeletons are preferred.

Preferably, the epoxy resin substantially contains no halogen atom. This improves heat resistance and thermal degradation resistance, as well as formability of the insulating layers 311. Here, "substantially contain no halogen atom" means a halogen atom content of 1 weight percent or less in the epoxy resin, for example.

Nonlimiting examples of the epoxy resins used in the insulating layers 311 include phenol novolak-type epoxy resins, bisphenol-type epoxy resins, naphthalene-type epoxy resins, and arylalkylene-type epoxy resins. Among these, preferred are arylalkylene-type epoxy resins, which improve flame resistance, moisture resistance, and thermal resistance against soldering. Here, arylalkylene-type epoxy resins have at least one arylalkylene group in the repeating units. Examples of such resins include xylylene-type epoxy resins and biphenyldimethylene-type epoxy resins.

The weight average molecular weight of the epoxy-resin is not limited, and is preferably 4,000 or less, more preferably in the range of 500 to 4,000, and most preferably in the range of 800 to 3,000. A weight average molecular weight less than the lower limit may cause tackiness of insulating layers 311. A weight average molecular weight exceeding the upper limit may cause soldering thermal resistance to decrease.

The content of the epoxy resin is not limited, and is in the range of preferably 5 weight percent to 50 weight percent and more preferably 10 weight percent to 40 weight percent of the entire resin composition of the insulating layers 311. An epoxy resin content of 5 weight percent or more leads to improvements in hygroscopic property, soldering thermal resistance, and adhesiveness.

The insulating layers 311 preferably contain phenoxy resins substantially containing no halogen atom in order to facilitate the formation of the insulating layers 311. Here, "substantially containing no halogen atom" means a halogen atom content of 1 weight percent or less in the phenoxy resin, for example.

The type of the phenoxy resin is not limited, and examples include phenoxy resins having bisphenol skeletons, phenoxy resins having novolak skeletons, phenoxy resins having naphthalene skeletons, and phenoxy resins having biphenyl skeletons. Also phenoxy resins having these skeletons in combination may be used. Among these preferred are phenoxy resins biphenyl skeletons and bisphenol S skeletons. The rigidity of the biphenyl skeleton leads to an increase in glass transition temperature while the bisphenol S skeleton leads to an improvement in adhesion of plating metal. Also the phenoxy resin having both bisphenol A skeletons and bisphenol F skeletons may be used. The phenoxy resin having both the biphenyl skeleton and the bisphenol S skeleton and the phenoxy resin having both the bisphenol A skeleton and the bisphenol F skeleton can be used in combination. The combined use of these phenoxy resins contributes to development of well-balanced properties. In the combined use of both the phenoxy resin (1) having both the bisphenol A skeleton and the bisphenol F skeleton and the phenoxy resin (2) having both the biphenyl skeleton and the bisphenol S skeleton, the ratio is not limited. For example, the ratio (1):(2) is in the range of 2:8 to 9:1.

The molecular weight of the phenoxy resin is not limited. The weight average molecular weight is in the range of preferably 5000 to 50000 and more preferably 10000 to 40000. At a weight average molecular weight of 5000 or more, the formation of the layer can be facilitated. At an average molecular weight of 50000 or less, phenoxy resin has adequate solubility.

The phenoxy resin content is not limited, and is in the range of preferably 1 weight percent to 40 weight percent and more preferably 5 weight percent to 30 weight percent of the overall resin composition of the insulating layers 311. A content of less than 1 weight percent may impair the formation of the layer. A content exceeding 40 weight percent may impair low thermal expansion coefficient.

The insulating layers 311 may contain imidazole compounds as hardeners to accelerate the reaction of the cyanate resin and the epoxy resin contained in the insulating layers 311 while the insulating properties of the insulating layers 311 being maintained. Nonlimiting examples of the imidazole compounds include 2-phenyl-4-methylimidazole, 2-phenyl-4-methyl-5-hydroxymethylimidazole, 2-phenyl-4,5-dihydroxymethylimidazole, 2,4-diamino-6-[2'-methylimidazolyl-(1')]-ethyl-s-triazine, 2,4-diamino-6-(2'-undecylimidazolyl)-ethyl-s-triazine, 2,4-diamino-6-[2'-ethyl-4-methylimidazolyl-(1')]-ethyl-s-triazine, and 1-benzyl-2-phenylimidazole. Among these preferred are imidazole compounds having two functional groups selected from the group consisting of aliphatic hydrocarbon groups, aromatic hydrocarbons groups, hydroxyalkyl groups, and cyanoalkyl groups. In particular, 2-phenyl-4,5-dihydroxymethylimidazole is preferred. The insulating layers 311 can thereby exhibit improved thermal resistance, and have a low thermal expansion coefficient and a low water absorption coefficient.

The content of the imidazole compound is not limited. When the insulating layers 311 contains the cyanate resin and the epoxy resin, the content is in the range of preferably 0.1 weight percent to 5 weight percent and more preferably 0.3 weight percent and 3 weight percent of the total amount of these resins in order to improve thermal resistance particularly.

The insulating layers 311 preferably contain a coupling agent in order to improve wettability at the interface with the resin. As a result, thermal resistance, in particular, moisture-absorption characteristics and soldering thermal resistance can be improved.

The type of the coupling agents is not limited. It is preferred to use at least one coupling agent selected from epoxysilane coupling agents, titanate coupling agents, aminosilane coupling agents, and silicone oil coupling agents. The wettability at the interface between the resin and the inorganic filler can be significantly improved, resulting in a further improvement in thermal resistance.

Furthermore, the insulating layers 311 may contain other additives such as defoamers and leveling agents, if necessary, in addition to the components described above.

The linear expansion coefficient of the insulating layers 311 of the buildup layer 31 of the substrate 3 in the in-plane direction of the substrate is 35 ppm/° C. or less. Preferably, the linear expansion coefficient of the insulating layers 311 of the buildup layer 31 of the substrate 3 in the in-plane direction of the substrate is 30 ppm/° C. or less.

The linear expansion coefficient of the insulating layers 311 of the buildup layer 31 of the substrate 3 in the thickness direction of the substrate 35 ppm/° C. or less and more preferably 30 ppm/° C. or less.

The difference in the linear expansion coefficient between the underfill 6 and the insulating layers 311 of the buildup layer 31 is preferably 25 ppm/° C. or less, namely, the difference in the linear expansion coefficient between the substrate 3 in the in-plane direction of the substrate and the underfill 6 is preferably 25 ppm/° C. or less and more preferably 10 ppm/° C. or less.

The linear expansion coefficient of the insulating layers 311 is measured with a thermal mechanical analyzer (TMA) made by TA Instruments.

The linear expansion coefficient of the insulating layers 311 and the underfill 6 is the linear expansion coefficient at temperatures in the range from 25° C. to the glass transition temperature.

Preferably, the insulating layers 311 of the buildup layer 31 of the substrate 3 have a high glass transition temperature. For example, the glass transition temperature of the insulating layers 311 is preferably 230° C. or more and more preferably 250° C. or more.

The conductive interconnection layers 312 of the buildup layer 31 of the substrate 3 are now described.

A pair of conductive interconnection layers 312 disposed at both sides of the insulating layer 311 is connected to each other via a copper lead layer 313 formed in the via hole 311A of the insulating layers 311.

Among the conductive interconnection layers 312, the conductive interconnection layer 312A at the bottommost layer is, for example, a copper lead layer and has a structure shown in FIG. 3. The highly shaded portion in FIG. 3 indicates copper.

The residual copper rate (the proportion of the conductive interconnection layers 312A that cover the insulating layers 311) of the conductive interconnection layers 312A is 80%.

Figure 4:
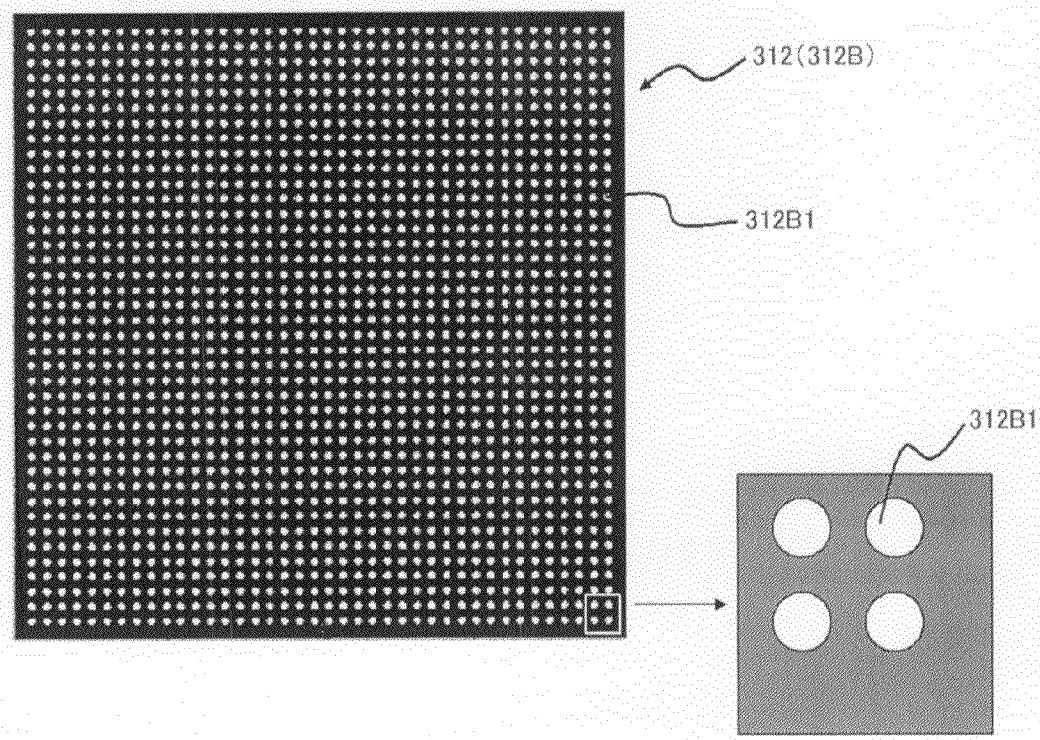
FIG. 4 is a plan view of a conductive interconnection layer of a substrate.

The conductive interconnection layers 312B disposed on the conductive interconnection layers 312A has a flat shape shown in FIG. 4 and provided with a plurality of substantially circular openings 312B1. The drawing at the right bottom in FIG. 4 is an enlarged view of the conductive interconnection layers 312B.

312B have a diameter of, for example, 500 μm. The residual copper rate of the conductive interconnection layers 312A is in the range of 60% to 90% and preferably 75% to 85%.

[Semiconductor Chip]

With reference to FIG. 1, the semiconductor chip 4 is provided with an interconnection layer 42 composed of a so-called low-k film on a silicon substrate 41.

Its functions are not limited and include logic devices, memory devices and mixed mounting thereof.

The low-k film functions as an interlayer insulating film.

Here, the low-k film indicates a film having a relative permittivity of 3.3 or less. Examples of low-k film include organic films of, for example, SiOC, MSQ (methylsilsesquioxane), and benzocyclobutene, and inorganic films of, for example, HSQ (hydroxysilsesquioxane). Porous films thereof can also be preferably used.

Conventional $SiO_2$ insulating films cannot be compatible with recent devices having higher operation capacity and higher processing rate. In order to reduce parasitic capacitance between interconnections, low-permittivity films and particularly porous low-permittivity films are preferably used as interlayer insulating films. However, low-k films having a dielectric constant of 3.3 or less are brittle, and face-down mounting semiconductor chips having low-k films cause conduction defects and cracks of the semiconductor chips. Low-k films having a relative permittivity of 2.7 must be porous and thus are significantly brittle.

The semiconductor chip 4 has a thickness of 100 μm.

The linear expansion coefficient of the semiconductor chip 4 at a temperature in the range of 25° C. to the glass transition temperature is in the range of 2 ppm/° C. to 5 ppm/° C. The difference in the linear expansion coefficient between the semiconductor chip 4 and the insulating layers 311 in the in-plane direction of the substrate is preferably 32 ppm/° C. or less.

[Underfill]

The underfill 6 is disposed to fill in gaps around bumps 5, which bond the substrate 3 and the semiconductor chip 4.

Materials used for the underfill 6 are liquid thermosetting resins and thermosetting resin films. Among these preferred are liquid thermosetting resins, which can effectively fills in the gaps between the substrate 3 and the semiconductor chip 4.

In this embodiment, for bumps 5 composed of a high-melting-point solder having a melting point of 230° C. or more (for example, tin/lead solder alloy having a lead content exceeding 85 wt %), the underfill 6 is composed of a resin material having an elastic modulus in the range of preferably 30 MPa to 3000 MPa and more preferably 45 MPa or more.

For bumps 5 of a lead-free solder, the underfill 6 is composed of a resin material having an elastic modulus in the range of preferably 150 MPa to 800 MPa and more preferably 200 MPa or more.

The elastic modulus is determined as follows: Paste of the underfill 6 is shaped into a width of 10 mm, a length of about 150 mm, and a thickness of 4 mm, and is cured for 30 minutes in an oven at 200° C. The sample is measured at a rate of 1 mm/min under an atmosphere at 125° C. with a Tensilon tester and the elastic modulus is calculated from the initial slop on the resulting stress-strain curve.

Various resin materials can be used for the underfill 6. For example, epoxy resins, BT resins, and cyanate resins can be used. Preferred cyanate resins are novolak cyanate resins described in the section regarding the materials for the substrate.

The resin materials for the underfill 6 preferably contain polyfunctional epoxy resins in order to enhance the crosslink density of the cured resin and to achieve high elastic modulus.

The underfill 6 may contain inorganic fillers such as silica particles in order to reduce the linear expansion coefficient and to reduce damage of the semiconductor chip 4 and damage between the semiconductor chip 4 and the substrate 3, more effectively.

The underfill 6 may contain any coupling agent in order to improve adhesion of the underfill to the bump and the inorganic fillers. As a result, the linear expansion coefficient, the damage of semiconductor chip and damage between the semiconductor chip and the substrate 3 can be more effectively suppressed. Examples of the coupling agents include silane coupling agents, such as epoxysilanes and aminosilanes, and titanate coupling agents. These may be used in combination. The coupling agents may be dispersed in a binder portion of the underfill or is bound on the surfaces of the inorganic filler, such as silica particles. Alternatively, these forms may be mingled. For example, when silica particles are contained, the surfaces of silica particles may be preliminarily treated with coupling agents.

The linear expansion coefficient of the underfill 6 is preferably not greater than 40 ppm/° C. and more preferably not greater than 30 ppm/° C. in order to suppress damage of the low-k film and damage at the peripheries of the bumps 5.

[Bumps]

The bumps 5 are composed of a lead-free solder or a high-melting-point solder.

Examples of the lead-free solder include tin-silver solders, tin-bismuth solders, tin-zinc solders, tin-copper solders, copper materials such as copper pillars and copper posts, and gold materials such as gold studs.

Examples of the high-melting-point solders are tin-lead solders.

The difference between the linear expansion coefficient of the underfill 6 and the linear expansion coefficient of the bumps 5 is preferably 10 ppm/° C. or less.

In addition, the linear expansion coefficient of the bumps 5 is in the range of 10 ppm/° C. to 30 ppm/° C.

Figure 5:
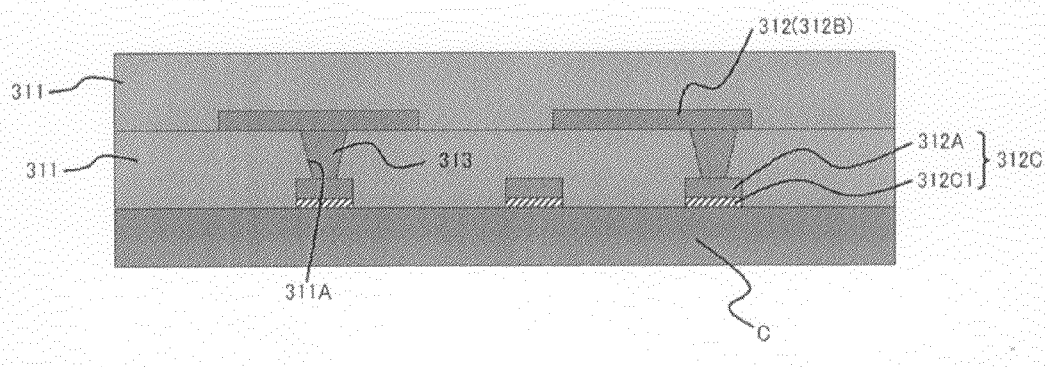
FIG. 5 is a cross-sectional view illustrating a production step of a substrate.

A method for making the semiconductor device 1 will now be described with reference to FIGS. 5 and 6.

Insulating layers 311 are prepared. Resin varnish for insulating layers 311 is prepared and is applied on a support. The resin varnish on the support is dried to form the insulating layers 311. Examples of usable support include heat-resistant thermoplastic resin films, such as polyester resins e.g. polyethylene terephthalate and polybutylene terephthalate, fluorine resins, and polyimides.

The insulating layers 311 has a thickness in the range of preferably 10 μm to 100 μm and more preferably 20 to 80 μm in order to prevent cracking in the insulating layers 311.

Conductive interconnection layers 312C having a predetermined pattern is formed on a surface of a copper plate C having a predetermined thickness.

The conductive interconnection layers 312C each have a double-layer configuration including a first metal layer 312C1 and a second metal layer 312A laminated on the first metal layer and composing the conductive interconnection layers 312A.

The first metal layer 312C1 is made of, for example, nickel, and second metal layer 312A is made of copper as described above. The pattern of the conductive interconnection layers 312C is shown in FIG. 3.

After the surface of the copper plate C and the conductive interconnection layers 312C are roughened with a chemical solution, the insulating layer 311 is laminated on the conductive interconnection layer 312C (lamination step). In this step, the surface of the insulating layers 311 on the support is put into contact with the conductive interconnection layer 312C, these are pressed with heat, and then the support is removed.

Via holes 311A are formed at predetermined positions of the insulating layers 311 by laser (via hole forming step).

Next, a lead layer 313 in the via hole 311A and a conductive interconnection layers 312B shown in FIG. 4 are formed by a semiactive process.

To be more precise, a copper film (seed film) with a thickness of about 1 μm is formed on the entire insulating layer 311 by electroless deposition. A photoresist layer (mask) having a predetermined pattern is formed on the insulating layer 311. A plating layer is formed on mask-free portions (for example, via hole 311A) by electrolytic plating. Thereby, a lead layer 313 is formed in the via hole 311A and a conductive interconnection layer 312B is formed (step of forming lead layer 313 and conductive interconnection layer 312B).

Afterwards, the mask is removed and the exposed seed film is removed.

Next, the conductive interconnection layer 312B is roughened and is subjected to the lamination step, the via hole forming step, and the step of forming lead layer 313 and conductive interconnection layer 312B.

Figure 6:
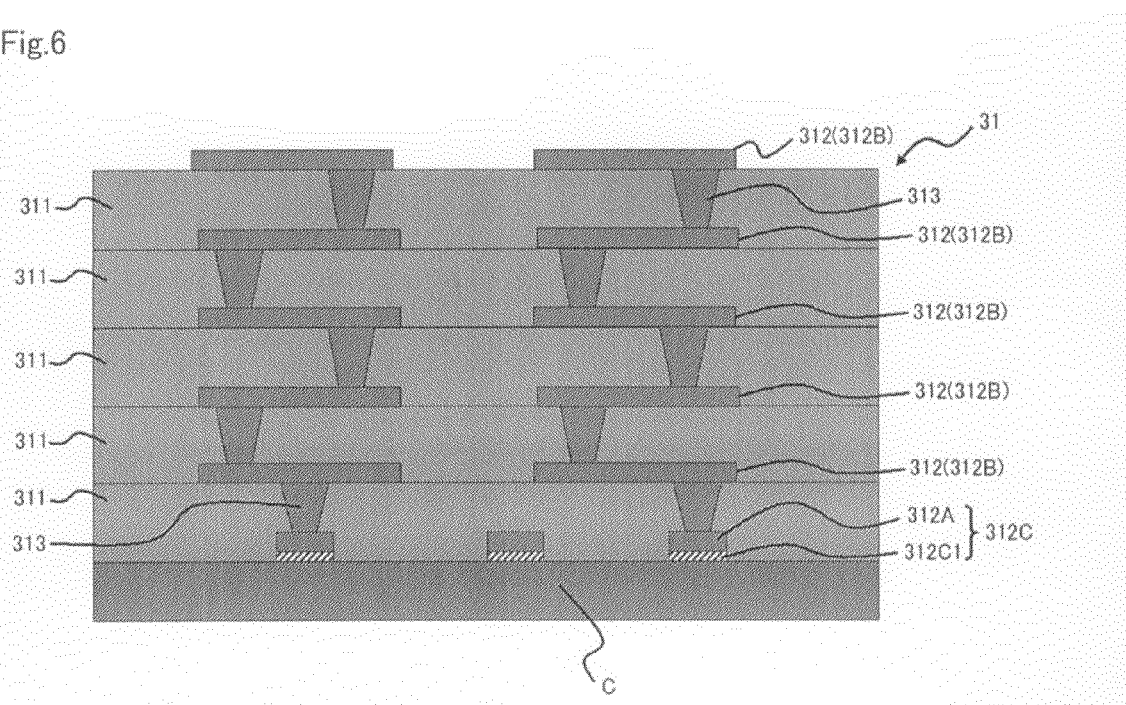
FIG. 6 is a cross-sectional view illustrating a production step of a substrate.

By repeating such operation, buildup layers 31 including five insulating layers 311 and six conductive interconnection layers 312 shown in FIG. 6 is prepared.

Afterwards, an etching resist film (not shown in the drawing) is formed on the uppermost conductive interconnection layer 312B. The copper plate C is removed by etching.

Furthermore, the first metal layer 312C1 is removed with a nickel-removing solution. As a result, a substrate 3 is prepared as shown in FIG. 2.

Next, a semiconductor chip 4 is mounted onto the resulting substrate 3. Solder bumps 5 are preliminarily provided on the back surface of the semiconductor chip 4. The semiconductor chip 4 is placed on substrate 3 via the solder bumps 5, and then the solder bumps 5 is melted in a reflow furnace to fix the semiconductor chip 4 on the substrate 3.

The gap between the substrate 3 and the semiconductor chip 4 is filled with an underfill 6.

Through these steps, a semiconductor device 1 is prepared.

The resulting semiconductor device 1, as shown in FIG. 1, is mounted on the printed-wiring board 2 via the solder bumps B.

The advantages of this embodiment will now be described.

In this embodiment, for bumps 5 composed of a high-melting-point solder having a melting point of 230° C. or more, the elastic modulus of the underfill 6 is controlled to 30 MPa or and 3000 MPa less, whereas for bumps 5 composed of a lead-free solder, the elastic modulus of the underfill 6 is controlled to 150 MPa or more and 800 MPa or less.

The use of the underfill 6 having such an elastic modulus ensures tight fixation around the bumps 5, resulting in prevention of cracking of the bumps 5.

Since the linear expansion coefficient of the insulating layer 311 of the buildup layer 31 in the in-plane direction of the substrate at temperatures between 25° C. and the glass transition temperature is 35 ppm/PC or less, the warp of the buildup layer 31 is moderated, resulting in effective suppression of damage of the semiconductor chip 4, damage of the interface between the semiconductor chip 4 and the bumps 5, and damage of the interface between the bumps 5 and the substrate 3.

In the semiconductor device 1 according to this embodiment, cracking in the bumps 5 can be prevented and damage of the semiconductor chip 4 can be suppressed.

Accordingly, in the semiconductor chip 4 having a low-dielectric layer having a relative permittivity of 3.3 or less (low-k film), the low-k film of the semiconductor chip 4 can be prevented from damaging.

The difference in linear expansion coefficient between the underfill 6 and the insulating layer 311 of the buildup layer 31 at temperatures between 25° C. and the glass transition temperature is controlled to 25 ppm/° C. or less to moderate distortion generated between the underfill 6 and the substrate 3.

Furthermore, the difference in linear expansion coefficient between the underfill 6 and the bump 5 at temperatures between 25° C. and the glass transition temperature may be controlled to 10 ppm/° C. or less to moderate distortion generated between the underfill 6 and the bump 5.

The resin of the insulating layer 311 containing the cyanate resin, particularly the novolak cyanate resin allows the insulating layer to have a linear expansion coefficient of 35 ppm/° C. or less in the in-plane direction of the substrate at 25° C. or more and the glass transition temperature or less. Also, the resin of the insulating layer 311 containing the cyanate resint particularly, the novolak cyanate resin enables the linear expansion coefficient in the thickness direction of the substrate 3 to decrease.

The present invention should not be limited to the embodiment described above and include variations and modifications within the scope that can achieve the object of the present invention.

Figure 7:
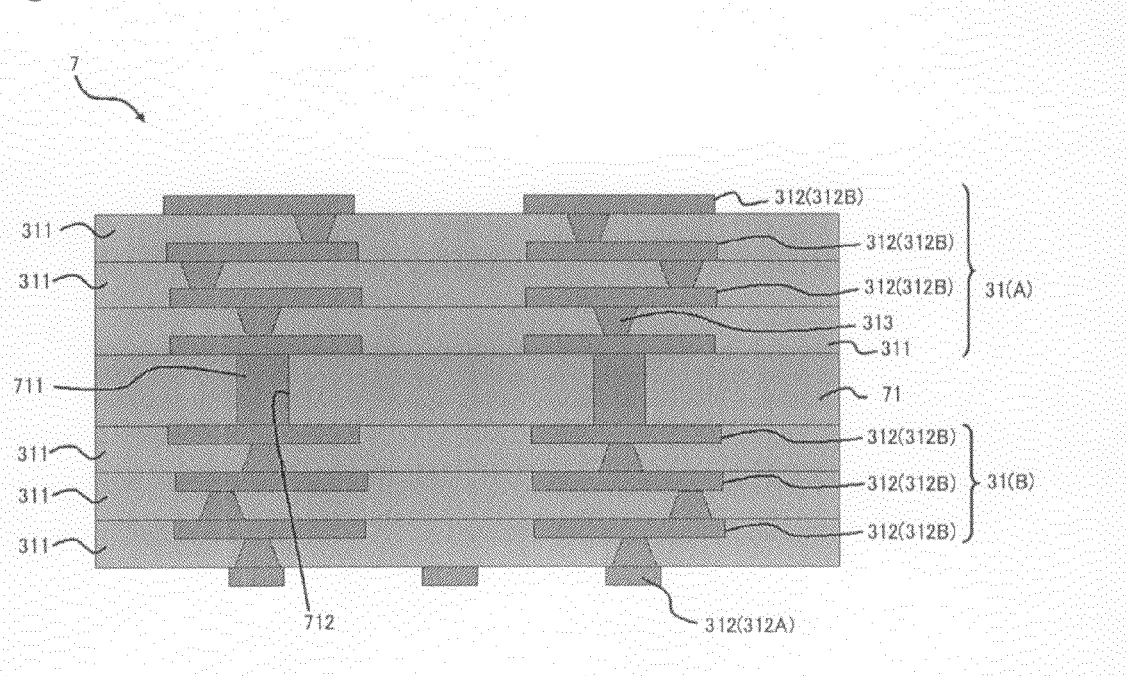
FIG. 7 is a cross-sectional view of a substrate according to a modification of the present invention.

For example, in the embodiment described above, the substrate 3 has only the buildup layer 31. Another substrate 7 (buildup substrate provided with inner circuit layer (core layer)) shown in FIG. 7 is also available. This substrate 7 includes buildup layers 31 as in the embodiment described above and a through hole 712 provided with a conductive layer 711 therein. The conductive layer 711 in the through hole 712 has a core layer 71 connected to the conductive interconnection layers 312.

The core layer 71 has an insulating layer formed by lamination of prepreg. The prepreg is composed of glass cloth impregnated with a resin composition containing at least one resin selected from epoxy resins, BT resins (bismaleimide-triazine resins), and cyanate resins (e.g. novolak cyanate resins). Preferably, the insulating layer of the core layer 71 contains a cyanate resin (in particular, novolak cyanate resin). The core layer 71 containing the cyanate resin (in particular, novolak cyanate resin) can reduce both the linear expansion coefficient of the substrate in the in-plane direction and the linear expansion coefficient of the substrate in the thickness direction.

Preferably, the core layer 71 has a thickness of 0.2 mm or less. A core layer 71 having a thickness of 0.2 mm or less can reduce the inductance of the substrate 7.

A through hole 712 is formed in the insulating layer of the core layer 71.

In the substrate 7, a pair of buildup layers 31 is disposed on two sides of the core layer 71. The buildup layer 31 (buildup layer 31A) at one side of the core layer 71 includes an insulating layer 311 and a conductive interconnection layer 312B. The buildup layer 31 (buildup layer 31B) at the other side of the core layer 71 includes an insulating layer 311, a conductive interconnection layer 312B, and a conductive interconnection layer 312A.

In the embodiment described above, the insulating layers 311 of the buildup layer 31 are not composed of prepreg prepared by impregnating fabrics or unidirectionally oriented fabrics of carbon or glass fiber with a variety of resins. However, the present invention is not limited to this.

The insulating layers 311 may contain skeletal materials, such as glass cloths and fiber cloths such as Zylon (registered trademark) and aramide in order to achieve a low linear expansion coefficient of the insulating layer in the in-plane direction.

The insulating layers 311 may also contain any inorganic filler in order to ensure low thermal expansion and high inflammability. Furthermore, a combination of a cyanate resin and/or its prepolymer (in particular, novolak cyanate resin) with an inorganic filler leads to an increase in the elastic modulus of the insulating layers 311.

The inorganic filler is not limited, and examples include talc, alumina, glass, silica, and mica. Among them preferred is silica, and particularly fused silica, which has low expansion. The fused silica is present in a crushed or spherical form, and a spherical shape is preferred since it can be compounded in the insulating layers 311 in a large amount without impairing high flowability.

The average particle diameter of the inorganic filler is not limited and is in the range of preferably 0.01 μm to 5 μm and more preferably 0.2 μm to 2 μm.

The content of the inorganic filler is not limited, and is in the range of preferably 20 weight percent to 70 weight percent, and more preferably 30 weight percent to 60 weight percent of the overall insulating layers 311. A content of 20 weight percent or more ensures low thermal expansion and low moisture absorption of the insulating layers 311. A content of 70 weight percent or less enables to prevent reducing flowability of the resin composition.

EXAMPLES

Examples of the present invention are now described.
First, the materials for the underfill are described.

Example 1-1

Preparation of Resin Composition: Bisphenol F Epoxy Resin with an epoxy equivalent of 165 (11 parts by weight), N-[2-methyl-4-(oxiranylmethoxy)phenyl]-N-(oxiranylmethyl)oxiranemethanamine (ELM-100 made by Sumitomo Chemical) (11 parts by weight), 4,4'-methylenbis-(2-ethylanilin) (Kayahard AA made by Nippon Kayaku Co. Ltd.) (10 parts by weight), γ-glycidylpropyltriethoxysilane (KBE403 made by Shin-Etsu Chemical Co., Ltd.) (1 part by weight), spherical fused silica with an average particle diameter of 0.5 μm (SO-25R made by Admatechs Corporation Limited) (65 parts by weight) were weighed, kneaded through a three-roll mill, and the blend was defoamed under vacuum to prepare a liquid resin composition.

Example 1-2

A resin composition was prepared as in Example 1-1 except that the formulation of the resin composition was changed as follows:

Bisphenol F epoxy resin with an epoxy equivalent of 165 (18 parts by weight), N-[2-methyl-4-(oxiranylmethoxy)phenyl]-N-(oxiranylmethyl)oxiranemethanamine (ELM-100 made by Sumitomo Chemical) (6 parts by weight), and 4,4'-methylenbis-(2-ethylanilin) (Kayahard AA made by Nippon Kayaku Co. Ltd.) (10 parts by weight) were used.

Example 1-3

A resin composition was prepared as in Example 1-1 except that the formulation of the resin composition was changed as follows:

Bisphenol F epoxy resin with an epoxy equivalent of 165 (25 parts by weight) and 4,4'-methylenbis-(2-ethylanilin) (Kayahard AA made by Nippon Kayaku Co. Ltd.) (8 parts by weight) were used. N-[2-methyl-4-(oxiranylmethoxy)phenyl]-N-(oxiranylmethyl) oxiranemethanamine (ELM-100 made by Sumitomo Chemical) was not used.

Example 1-4

Preparation of Resin Composition: Bisphenol F Epoxy Resin with an epoxy equivalent of 165 (5 parts by weight), N-[4-(oxiranylmethoxy)phenyl]-N-(oxiranylmethyl) oxiranemethanamine (JER630 made by Japan Epoxy Resins Co. Ltd.) (10 parts by weight), phenol, 4,4'-(1-methylethylidene)bis[2-(2-propenyl)]-, polymer with (chloromethyl)oxirane (RE-810NM made by Nippon Kayaku Co. Ltd.) (5 parts by weight), 4,4'-methylenbis-(2-ethylanilin) (Kayahard AA made by Nippon Kayaku Co. Ltd.) (6 parts by weight), 4,4'-methylenebis(N-methylaniline) (T12 made by Sanyo Chemical Industries, Ltd.) (6 parts by weight), γ-glycidylpropyltriethoxysilane (KBE403 made by Shin-Etsu Chemical Co., Ltd.) (1 part by weight), and spherical fused silica with an average particle diameter of 0.5 µm (SO-25R made by Admatechs Corporation Limited) (65 parts by weight) were weighed, kneaded through a three-roll mill, and the blend was defoamed under vacuum to prepare a liquid resin composition.

Example 1-5

A resin composition was prepared as in Example 1-4 except that the formulation of the resin composition was changed as follows:

Bisphenol F epoxy resin with an epoxy equivalent of 165 (9 parts by weight), Bisphenol F epoxy resin (epoxy equivalent 165) and N-[4-(oxiranylmethoxy)phenyl]-N-(oxiranylmethyl)oxiranemethanamine (JER630 made by Japan Epoxy Resins Co. Ltd.) (6 parts by weight) were used.

Example 1-6

A resin composition was prepared as in Example 1-4 except that the formulation of the resin composition was changed as follows:

Bisphenol F epoxy resin with an epoxy equivalent of 165 (17 parts by weight), phenol, 4,4'-(1-methylethylidene) bis[2-(2-propenyl)]-, polymer with (chloromethyl)oxirane (RE-810NM made by Nippon Kayaku Co. Ltd.) (6 parts by weight), 4,4'-methylenbis-(2-ethylanilin) (Kayahard AA made by Nippon Kayaku Co. Ltd.) (4 parts by weight), and 4,4'-methylenebis(N-methylaniline) (T12 made by Sanyo Chemical Industries, Ltd.) (4 parts by weight) were used. N-[4-(oxiranylmethoxy)phenyl]-N-(oxiranylmethyl)oxiranemethanamine (JER630 made by Japan Epoxy Resins Co. Ltd.) was not used.

Comparative Example 1-1

A resin composition was prepared as in Example 1-1 except that the formulation of the resin composition was changed as follows:

Bisphenol F epoxy resin with an epoxy equivalent of 165 (27 parts by weight) and 4,4'-methylenbis-(2-ethylanilin) (Kayahard AA made by Nippon Kayaku Co. Ltd.) (5 parts by weight) were used. N-[2-methyl-4-(oxiranylmethoxy)phenyl]-N-(oxiranylmethyl)oxiranemethanamine (ELM-100 made by Sumitomo Chemical) was not used.

Comparative Example 1-2

A resin composition was prepared as in Example 1-1 except that the formulation of the resin composition was changed as follows:

Bisphenol F epoxy resin with an epoxy equivalent of 165 (20 parts by weight), N-[2-methyl-4-(oxiranylmethoxy)phenyl]-N-(oxiranylmethyl)oxiranemethanamine (ELM-100 made by Sumitomo Chemical) (20 parts by weight), 4,4'-methylenbis-(2-ethylanilin) (Kayahard AA made by Nippon Kayaku Co. Ltd.) (19 parts by weight), γ-glycidylpropyltriethoxysilane (KBE403 made by Shin-Etsu Chemical Co., Ltd.) 1 part by weight, and spherical fused silica with an average particle diameter of 0.5 µm (SO-25R made by Admatechs Corporation Limited) (40 parts by weight) were used.

The resin composition prepared in Examples 1-1 to 1-6 and Comparative Examples 1-1 and 1-2 were evaluated as follow. The items for the evaluation are shown with a method for the evaluation. The results are shown in Table 1.

TABLE 1

|  | Example 1-1 | Example 1-2 | Example 1-3 | Comparative Example 1-1 | Comparative Example 1-2 | Example 1-4 | Example 1-5 | Example 1-6 |
|---|---|---|---|---|---|---|---|---|
| Bisphenol F epoxy resin (epoxy equivalent 165) | 11 | 18 | 25 | 27 | 20 | 5 | 9 | 17 |
| N-[2-Methyl-4-(oxiranylmethoxy)phenyl]-N-(oxiranylmethyl)oxiranemethanamine *1 | 11 | 6 | 0 | 0 | 20 | 0 | 0 | 0 |
| N-[4-(Oxiranylmethoxy)phenyl]-N-(oxiranylmethyl)oxiranemethanamine *2 | 0 | 0 | 0 | 0 | 0 | 10 | 6 | 0 |
| Phenol, 4,4'-(1-methylethylidene)bis[2-(2-propenyl)]-,polymer with (chloromethyl)oxirane *3 | 0 | 0 | 0 | 0 | 0 | 5 | 5 | 6 |
| 4,4'-Methylenbis-(2-ethylanilin) *4 | 10 | 10 | 8 | 5 | 19 | 6 | 6 | 4 |
| 4,4'-Methylenebis(N-methylaniline) *5 | 0 | 0 | 0 | 0 | 0 | 6 | 6 | 4 |
| γ-Glycidylpropyltriethoxysilane *6 | 1 | 1 | 1 | 1 | 1 | 1 | 1 | 1 |
| Spherical fused silica (an average particle diameter: 0.5 µm) *7 | 65 | 65 | 65 | 65 | 40 | 65 | 65 | 65 |
| Total | 98 | 100 | 99 | 98 | 100 | 98 | 98 | 97 |
| Glass transition temperature (° C.) | 100 | 90 | 80 | 70 | 100 | 100 | 90 | 80 |
| Flexural modulus (MPa: 125° C.) | 510 | 160 | 30 | 20 | 350 | 400 | 120 | 30 |
| Linear expansion coefficient (ppm/° C.) | 25 | 26 | 26 | 26 | 45 | 26 | 26 | 26 |

*1 ELM100: made by Sumitomo Chemical
*2 JER630: made by Japan Epoxy Resins Co. Ltd.
*3 RE-810NM: made by Nippon Kayaku Co. Ltd.
*4 Kayahard AA: made by Nippon Kayaku Co. Ltd.
*5 T12: made by Sanyo Chemical Industries, Ltd.
*6 KBM-403: made by Shin-Etsu Chemical Co., Ltd.
*7 SO-25R: made by Admatechs Corporation Limited Elastic modulus: The resin composition was shaped into a width of 10 mm, a length of about 150 mm, and a thickness of 4 mm, and was cured for 30 minutes in an oven at 200° C. The sample was measured at a rate of 1 mm/min under an atmosphere at 125° C. with a Tensilon tester and the elastic modulus was calculated from the initial slop on the resulting stress-strain curve.

Glass transition temperature and linear expansion coefficient: The resin composition was cured at 150° C. for 120 minutes, and was milled into a test piece of 5 mm by 5 mm by 10 mm. The test piece was subjected to a measurement at a heating rate of 10° C./min over the temperature range of −100° C. to 300° C. under a compressive load of 5 g with Seiko TMA/SS120. Simultaneously, the linear expansion coefficient was also determined between 25° C. and the glass transition temperature.

Next, a substrate is described.

Raw materials used in Examples and Comparative Examples are as follows:

(1) Cyanate resin A (novolak cyanate resin): "Primaset PT-30" made by Lonza, weight average molecular weight: 700

(2) Cyanate resin B (novolak cyanate resin): "Primaset PT-60" made by Lonza, weight average molecular weight: 2600

(3) Epoxy resin (biphenyldimethylene-type epoxy resin): "NC-3000P" made by Nippon Kayaku Co. Ltd., epoxy equivalent: 275, weight average molecular weight: 2000

(4) Phenoxy resin A (copolymer having epoxy end groups of a biphenyl epoxy resin and bisphenol S epoxy resin): "YX-8100H30" made by Japan Epoxy Resins Co. Ltd., weight average molecular weight: 30000

(5) Phenoxy resin B (copolymer having epoxy end groups of a bisphenol A epoxy resin and a bisphenol F epoxy resin): "EPIKOTE 4275" made by Japan Epoxy Resins Co. Ltd., weight average molecular weight: 60000

(6) Curing catalyst (imidazole compound): 2-phenyl-4,5-dihydroxymethylimidazole made by Shikoku Chemicals Corporation (7) Inorganic filler (spherical fused silica): "SO-25H" made by Admatechs Corporation Limited, average particle diameter: 0.5 μm (8) Coupling agent (epoxysilane coupling agent): "A-187" made by Nippon Unicar Company Limited The novolak cyanate resins (1) and (2) have structures represented by the formula (I).

Example 2-1

(1) Preparation of Resin Varnish

The cyanate resin A (25 parts by weight), the epoxy resin (25 parts by weight, the phenoxy resin A (5 parts by weight), the phenoxy resin B (5 parts by weight), and the curing catalyst (0.4 parts by weight) were dissolved and dispersed in methyl ethyl ketone. Next, the inorganic filler (40 parts by weight) and the coupling agent (0.2 parts by weight) were added, and the mixture was stirred for 10 minutes with a high-rate stirrer to prepare resin varnish having a solid content of 50 weight percent.

(2) Production of Insulating Layer Provided with Support

The resin varnish prepared by the step (1) was applied onto one side of a PET (polyethylene terephthalate) film (support) having a thickness of 38 μm with a comma coater. The coating was dried in a drying oven at 160° C. for 10 minutes. The dried insulating layer had a thickness of 60 μm.

(3) Production of Buildup Substrate Provided with Inner Circuit Layers (Core Layers)

The resulting insulating layer provided with the support was stacked on each side of an inner circuit substrate having predetermined inner circuits were formed on both sides thereof such that the surface of the insulating layer resides on the inside. The stack was pressed by heating under vacuum, 0.5 MPa and at a temperature of 100° C. for 60 seconds with a vacuum pressure laminator. After the support was removed, the laminate was cured by heating at a temperature of 150° C. for 60 minutes with a hot-air dryer. Since the substrate was copper-plated by a general additive process. These steps were repeated to prepare a buildup substrate provided with inner circuit layers (core layers) in which each buildup layer has a three-layer structure.

The inner circuit layer (core layer) used had the following layers

Insulating layer: halogen-free FR-5 equivalent (MCL-E-679F made by Hitachi Chemical Company, Ltd), thickness: 0.2 mm Conductive layer: copper foil, thickness: 18 μm, L/S=120/180 μm, clearance hole diameter: 1 mm and 3 mm, slit: 2 mm (4) Production of Core-Less Buildup Substrate The resulting insulating layer provided with support was stacked to a copper plate with a thickness of 200 μm such that the surface of the insulating layer resides on the inside. The stack was pressed by heating under vacuum, 0.5 MPa and at a temperature of 100° C. for 60 seconds with a vacuum pressure laminator. After the support was removed, the laminate was cured by heating at a temperature of 150° C. for 60 minutes with a hot-air dryer. The substrate was copper-plated by a general additive process. These steps were repeated to give predetermined number of layers, and the copper plate was removed by etching to prepare a core-less eight-layer buildup substrate.

Example 2-2

The cyanate resin A (15 parts by weight), the cyanate resin B (10 parts by weight), the epoxy resin (25 parts by weight), the phenoxy resin A (5 parts by weight), the phenoxy resin B (5 parts by weight), and the curing catalyst (0.4 parts by weight) were dissolved and dispersed in methyl ethyl ketone. Next, the inorganic filler (40 parts by weight) and the coupling agent (0.2 parts by weight) were added, and the mixture was stirred for 10 minutes with a high-rate stirrer to prepare resin varnish having a solid content of 50 weight percent.

Using the resin varnish, an insulating layer provided with a support, a buildup substrate provided with inner circuit layers (core layers), and a core-less buildup substrate were prepared as in Example 2-1.

Example 2-3

The cyanate resin A (40 parts by weight), the epoxy resin (10 parts by weight), the phenoxy resin A (5 parts by weight), the phenoxy resin B (5 parts by weight), and the curing catalyst (0.4 parts by weight) were dissolved and dispersed in methyl ethyl ketone. Next, the inorganic filler (40 parts by weight) and the coupling agent (0.2 parts by weight) were added, and the mixture was stirred for 10 minutes with a high-rate stirrer to prepare resin varnish having a solid content of 50 weight percent.

Using the resin varnish, an insulating layer provided with a support, a buildup substrate provided with inner circuit layers (core layers), and a core-less buildup substrate were prepared as in Example 2-1.

Example 2-4

The cyanate resin A (20 parts by weight), the epoxy resin (30 parts by weight), the phenoxy resin A (5 parts by weight), the phenoxy resin B (5 parts by weight), and the curing catalyst (0.4 parts by weight) were dissolved and dispersed in methyl ethyl ketone. Next, the inorganic filler (40 parts by weight) and the coupling agent (0.2 parts by weight) were added, and the mixture was stirred for 10 minutes with a high-rate stirrer to prepare resin varnish having a solid content of 50 weight percent.

Using the resin varnish, an insulating layer provided with a support, a buildup substrate provided with inner circuit layers (core layers), and a core-less buildup substrate were prepared as in Example 2-1.

Example 2-5

The cyanate resin A (30 parts by weight), the epoxy resin (15 parts by weight), the phenoxy resin A (10 parts by weight), the phenoxy resin B (5 parts by weight), and the curing catalyst (0.4 parts by weight) were dissolved and dispersed in methyl ethyl ketone. Next, the inorganic filler (40 parts by weight) and the coupling agent (0.2 parts by weight) were added, and the mixture was stirred for 10 minutes with a high-rate stirrer to prepare resin varnish having a solid content of 50 weight percent.

Using the resin varnish, an insulating layer provided with a support, a buildup substrate provided with inner circuit layers (core layers), and a core-less buildup substrate were prepared as in Example 2-1.

Example 2-6

The cyanate resin A (17 parts by weight), the epoxy resin (17 parts by weight), the phenoxy resin A (3 parts by weight), the phenoxy resin B (3 parts by weight), and the curing catalyst (0.4 parts by weight) were dissolved and dispersed in methyl ethyl ketone. Next, the inorganic filler (60 parts by weight) and the coupling agent (0.2 parts by weight) were added, and the mixture was stirred for 10 minutes with a high-rate stirrer to prepare resin varnish having a solid content of 50 weight percent.

Using the resin varnish, an insulating layer provided with a support, a buildup substrate provided with inner circuit layers (core layers), and a core-less buildup substrate were prepared as in Example 2-1.

Comparative Example 2-1

The epoxy resin (50 parts by weight), the phenoxy resin A (7 parts by weight), the phenoxy resin B (3 parts by weight), and the curing catalyst (0.4 parts by weight) were dissolved and dispersed in methyl ethyl ketone. Next, the inorganic filler (40 parts by weight) and the coupling agent (0.2 parts by weight) were added, and the mixture was stirred for 10 minutes with a high-rate stirrer to prepare resin varnish having a solid content of 50 weight percent.

Using the resin varnish, an insulating layer provided with a support, a buildup substrate provided with inner circuit layers (core layers), and a core-less buildup substrate were prepared as in Example 2-1.

Comparative Example 2-2

The cyanate resin A (30 parts by weight), the cyanate resin B (10 parts by weight), the epoxy resin (50 parts by weight), the phenoxy resin A (3 parts by weight), the phenoxy resin B (7 parts by weight), and the curing catalyst (0.8 parts by weight) were dissolved and dispersed in methyl ethyl ketone to prepare resin varnish having a solid content of 50 weight percent.

Using the resin varnish, an insulating layer provided with a support, a buildup substrate provided with inner circuit layers (core layers), and a core-less buildup substrate were prepared as in Example 2-1.

The insulating layers provided with the supports of Examples 2-1 to 2-6 and Comparative Examples 2-1 and 2-2 were evaluated. The results are shown in Table 2.

TABLE 2

|  |  | Example 2-1 | Example 2-2 | Example 2-3 | Example 2-4 | Example 2-5 | Example 2-6 |
|---|---|---|---|---|---|---|---|
| Cyanate resin | Primaset PT-30 | 25 | 15 | 40 | 20 | 30 | 17 |
|  | Primaset PT-60 |  | 10 |  |  |  |  |
| Epoxy resin | NC-3000P | 25 | 25 | 10 | 30 | 15 | 17 |
| Phenoxy resin | YX-8100H30 | 5 | 5 | 5 | 5 | 10 | 3 |
|  | EP-4275 | 5 | 5 | 5 | 5 | 5 | 3 |
| Curing catalyst | Imidazole compound | 0.4 | 0.4 | 0.4 | 0.4 | 0.4 | 0.4 |
| Inorganic filler | SO-25H | 40 | 40 | 40 | 40 | 40 | 60 |
| Coupling agent | A-187 | 0.2 | 0.2 | 0.2 | 0.2 | 0.2 | 0.3 |
| Total |  | 100.6 | 100.6 | 100.6 | 100.6 | 100.6 | 100.7 |
| Glass transition temperature | °C. | 240 | 240 | 260 | 220 | 250 | 240 |
| Linear expansion coefficient | ppm/°C. | 30 | 30 | 25 | 33 | 35 | 20 |

|  |  | Comparative Example 2-1 | Comparative Example 2-2 |
|---|---|---|---|
| Cyanate resin | Primaset PT-30 |  | 30 |
|  | Primaset PT-60 |  | 10 |

TABLE 2-continued

| | | | |
|---|---|---|---|
| Epoxy resin | NC-3000P | 50 | 50 |
| Phenoxy resin | YX-8100H30 | 7 | 3 |
| | EP-4275 | 3 | 7 |
| Curing catalyst | Imidazole compound | 0.4 | 0.8 |
| Inorganic filler | SO-25H | 40 | |
| Coupling agent | A-187 | 0.2 | |
| | Total | 100.6 | 100.8 |
| Glass transition temperature | °C. | 170 | 230 |
| Linear expansion coefficient | ppm/°C. | 40 | 45 |

The evaluation was carried out as follows:
(1) Glass Transition Temperature

Two insulating layers provided with supports were stacked such that the insulating layers face each other, and the stack was pressed by heating under a pressure of 2 MPa and a temperature of 200° C. for 2 hours with a vacuum press machine. The supports were removed. From the cured insulating layer, a test sample of 10 mm by 30 mm was prepared by cutting, and was heated at a heating rate of 5° C./min with a DMA (made by TA Instruments). The glass transition temperature was determined from the peak of tan δ.

(2) Linear Expansion Coefficient

Two insulating layers provided with supports were stacked such that the insulating layers face each other, and the stack was pressed by heating under a pressure of 2 MPa and a temperature of 200° C. for 2 hours with a vacuum press machine. The supports were removed. From the cured insulating layer, a test sample of 4 mm by 20 mm was prepared by cutting, and was heated at a heating rate of 10° C./min with a TMA (made by TA Instruments).

The linear expansion coefficient between 25° C. and the glass transition temperature was measured. Also, the linear expansion coefficient along the plane of the cured insulating layer (in the in-plane direction of the substrate, as exemplified by the directions A in FIG. 2) was measured. In these Examples and Comparative Examples, the linear expansion coefficient in the thickness direction of the cured insulating layer (thickness direction of the substrate) is the same as that in the plane direction of the cured insulating layer (in-plane direction of the substrate).

<Production and Evaluation (1) of Semiconductor Device Test Sample>

Bump electrodes were formed on the buildup substrate provided with inner circuit layers (core layers) and the coreless buildup substrate prepared in Examples 2-1 to 2-6 and Comparative Examples 2-1 and 2-2.

Next, with a flip-chip bonder, lead-free solder (composition: Sn-3.5Ag, melting point: 221° C., thermal expansion coefficient: 22 ppm/° C., elastic modulus: 44 GPa) was placed at predetermined positions so as to be temporally fixed to a semiconductor element (hereinafter, referred to as semiconductor element A) having an interlayer insulating film of a low-permittivity material (porous SiOC film formed by CVD, relative permittivity=2.2). Furthermore, these were moved to a reflow furnace (reflow conditions: IR reflow for 60 second at maximum temperature of 260° C. and a minimum temperature of 183° C.) to bond the solder bumps.

Similarly, with a high-melting-point solder (composition: Sn-95Pb, melting point: 314° C., thermal expansion coefficient: 30 ppm/° C., elastic modulus: 16 GPa), the semiconductor element A was bonded. A eutectic solder was used as a presolder at the substrate, and the IR reflow was carried out for 60 seconds at a maximum temperature of 245° C. and a minimum temperature of 183° C.

The resin compositions prepared in Examples 1-1 to 1-6 and Comparative Examples 1-1 and 1-2 were supplied as underfills to make semiconductor devices to be tested.

Since the semiconductor element A had a linear expansion coefficient of 3 ppm/° C., the values of (the linear expansion coefficient of the insulating layer of the buildup layer of the buildup substrate in the in-plane direction of the substrate)–(the linear expansion coefficient of the semiconductor element A) were 27, 27, 22, 30, 32, 17, 37 and 42 ppm/° C. for Example 2-1, Example 2-2, Example 2-3, Example 2-4, Example 2-5, Example 2-6, Comparative Example 2-1, and Comparative Example 2-2, respectively.

Since the lead-free solder bumps had a linear expansion coefficient of 22 ppm/° C., the values of (the linear expansion coefficient of the underfill)–(the linear expansion coefficient of the lead-free solder bump) were 3, 4, 4, 4, 4, 4, 4 and 23 ppm/° C. for Example 1-1, Example 1-2, Example 1-3, Example 1-4, Example 1-5, Example 1-6, Comparative Example 1-1, and Comparative Example 1-2, respectively.

Since the high-melting-point solder bump had a linear expansion coefficient of 30 ppm/° C., the values of (the linear expansion coefficient of the underfill)-(the linear expansion coefficient of the high-melting-point solder bump) were 5, 4, 4, 4, 4, 4, 4 and 15 ppm/° for Example 1-1, Example 1-2, Example 1-3, Example 1-4, Example 1-5, Example 1-6, Comparative Example 1-1, and Comparative Example 1-2, respectively.

Table 3 shows the value of (the linear expansion coefficient of the underfill)-(the linear expansion coefficient of the insulating layer of the buildup layer) of each sample.

TABLE 3

| | Insulating layer of buildup substrate | | | | | | | |
|---|---|---|---|---|---|---|---|---|
| | Example 2-1 | Example 2-2 | Example 2-3 | Example 2-4 | Example 2-5 | Example 2-6 | Comparative Example 2-1 | Comparative Example 2-2 |
| Example 1-1 | 5 | 5 | 0 | 8 | 10 | 5 | 15 | 20 |
| Example 1-2 | 4 | 4 | 1 | 7 | 9 | 6 | 14 | 19 |
| Example 1-3 | 4 | 4 | 1 | 7 | 9 | 6 | 14 | 19 |
| Comparative | 4 | 4 | 1 | 7 | 9 | 6 | 14 | 19 |

TABLE 3-continued

| | Insulating layer of buildup substrate | | | | | | | |
|---|---|---|---|---|---|---|---|---|
| | Example 2-1 | Example 2-2 | Example 2-3 | Example 2-4 | Example 2-5 | Example 2-6 | Comparative Example 2-1 | Comparative Example 2-2 |
| Example 1-1 Comparative Example 1-2 | 15 | 15 | 20 | 12 | 10 | 25 | 5 | 0 |
| Example 1-4 | 4 | 4 | 1 | 7 | 9 | 6 | 14 | 19 |
| Example 1-5 | 4 | 4 | 1 | 7 | 9 | 6 | 14 | 19 |
| Example 1-6 | 4 | 4 | 1 | 7 | 9 | 6 | 14 | 19 |

Next, the resulting semiconductor device to be tested was subjected to a thermal cycle test.

After the thermal cycle test (1000 cycles at a cold state of −55° C. and a heated state of 125° C.), samples of which all bumps had conductivity in a conductivity test were counted as nondefective products. Tables 4 to 7 show the results. Table 4 indicates the results of the semiconductor devices each of which has the buildup substrate provided with inner circuit layers (core layers) and the high-melting-point solder. Table 5 indicates the results of the semiconductor devices each of which has the core-less buildup substrate and the high-melting-point solder. Table 6 indicates the results of the semiconductor devices each of which has the buildup substrate provided with inner circuit layers (core layers) and the lead-free solder. Table 7 indicates the results of the semiconductor devices each of which has the core-less buildup substrate and the lead-free solder.

The results of the conductivity test were evaluated as an indicator by the ratio of the number of the nondefective products to ten tested samples.

TABLE 4

| | Insulating layer of buildup substrate | | | | | | | |
|---|---|---|---|---|---|---|---|---|
| | Example 2-1 | Example 2-2 | Example 2-3 | Example 2-4 | Example 2-5 | Example 2-6 | Comparative Example 2-1 | Comparative Example 2-2 |
| Example 1-1 | 0/10 | 0/10 | 0/10 | 0/10 | 0/10 | 0/10 | 0/10 | 0/10 |
| Example 1-2 | 0/10 | 0/10 | 0/10 | 0/10 | 0/10 | 0/10 | 0/10 | 0/10 |
| Example 1-3 | 0/10 | 0/10 | 0/10 | 0/10 | 0/10 | 0/10 | 0/10 | 0/10 |
| Comparative Example 1-1 | 1/10 | 2/10 | 1/10 | 3/10 | 3/10 | 1/10 | 5/10 | 7/10 |
| Comparative Example 1-2 | 2/10 | 2/10 | 1/10 | 3/10 | 3/10 | 1/10 | 6/10 | 7/10 |
| Example 1-4 | 0/10 | 0/10 | 0/10 | 0/10 | 0/10 | 0/10 | 0/10 | 0/10 |
| Example 1-5 | 0/10 | 0/10 | 0/10 | 0/10 | 0/10 | 0/10 | 0/10 | 0/10 |
| Example 1-6 | 0/10 | 0/10 | 0/10 | 0/10 | 0/10 | 0/10 | 0/10 | 0/10 |

TABLE 5

| | Insulating layer of buildup substrate | | | | | | | |
|---|---|---|---|---|---|---|---|---|
| | Example 2-1 | Example 2-2 | Example 2-3 | Example 2-4 | Example 2-5 | Example 2-6 | Comparative Example 2-1 | Comparative Example 2-2 |
| Example 1-1 | 0/10 | 0/10 | 0/10 | 0/10 | 0/10 | 0/10 | 0/10 | 0/10 |
| Example 1-2 | 0/10 | 0/10 | 0/10 | 0/10 | 0/10 | 0/10 | 0/10 | 0/10 |
| Example 1-3 | 0/10 | 0/10 | 0/10 | 0/10 | 0/10 | 0/10 | 0/10 | 0/10 |
| Comparative Example 1-1 | 3/10 | 3/10 | 2/10 | 6/10 | 10/10 | 2/10 | 8/10 | 8/10 |
| Comparative Example 1-2 | 4/10 | 4/10 | 2/10 | 6/10 | 10/10 | 2/10 | 9/10 | 9/10 |
| Example 1-4 | 0/10 | 0/10 | 0/10 | 0/10 | 0/10 | 0/10 | 0/10 | 0/10 |
| Example 1-5 | 0/10 | 0/10 | 0/10 | 0/10 | 0/10 | 0/10 | 0/10 | 0/10 |
| Example 1-6 | 0/10 | 0/10 | 0/10 | 0/10 | 0/10 | 0/10 | 0/10 | 0/10 |

TABLE 6

| | Insulating layer of buildup substrate | | | | | | | |
|---|---|---|---|---|---|---|---|---|
| | Example 2-1 | Example 2-2 | Example 2-3 | Example 2-4 | Example 2-5 | Example 2-6 | Comparative Example 2-1 | Comparative Example 2-2 |
| Example 1-1 | 0/10 | 0/10 | 0/10 | 0/10 | 0/10 | 0/10 | 0/10 | 0/10 |
| Example 1-2 | 0/10 | 0/10 | 0/10 | 0/10 | 0/10 | 0/10 | 0/10 | 0/10 |
| Example 1-3 | 1/10 | 1/10 | 1/10 | 2/10 | 3/10 | 1/10 | 6/10 | 8/10 |
| Comparative Example 1-1 | 3/10 | 4/10 | 2/10 | 5/10 | 7/10 | 2/10 | 10/10 | 10/10 |

TABLE 6-continued

| | Insulating layer of buildup substrate | | | | | | | |
|---|---|---|---|---|---|---|---|---|
| | Example 2-1 | Example 2-2 | Example 2-3 | Example 2-4 | Example 2-5 | Example 2-6 | Comparative Example 2-1 | Comparative Example 2-2 |
| Comparative Example 1-2 | 4/10 | 4/10 | 2/10 | 6/10 | 7/10 | 2/10 | 10/10 | 10/10 |
| Example 1-4 | 0/10 | 0/10 | 0/10 | 0/10 | 0/10 | 0/10 | 0/10 | 0/10 |
| Example 1-5 | 0/10 | 0/10 | 0/10 | 0/10 | 0/10 | 0/10 | 0/10 | 0/10 |
| Example 1-6 | 0/10 | 0/10 | 0/10 | 0/10 | 0/10 | 0/10 | 4/10 | 5/10 |

TABLE 7

| | Insulating layer of buildup substrate | | | | | | | |
|---|---|---|---|---|---|---|---|---|
| | Example 2-1 | Example 2-2 | Example 2-3 | Example 2-4 | Example 2-5 | Example 2-6 | Comparative Example 2-1 | Comparative Example 2-2 |
| Example 1-1 | 0/10 | 0/10 | 0/10 | 0/10 | 0/10 | 0/10 | 0/10 | 0/10 |
| Example 1-2 | 0/10 | 0/10 | 0/10 | 0/10 | 0/10 | 0/10 | 0/10 | 0/10 |
| Example 1-3 | 2/10 | 2/10 | 2/10 | 2/10 | 3/10 | 1/10 | 10/10 | 8/10 |
| Comparative Example 1-1 | 5/10 | 6/10 | 2/10 | 8/10 | 10/10 | 3/10 | 10/10 | 10/10 |
| Comparative Example 1-2 | 5/10 | 6/10 | 3/10 | 9/10 | 10/10 | 4/10 | 10/10 | 10/10 |
| Example 1-4 | 0/10 | 0/10 | 0/10 | 0/10 | 0/10 | 0/10 | 0/10 | 0/10 |
| Example 1-5 | 0/10 | 0/10 | 0/10 | 0/10 | 0/10 | 0/10 | 0/10 | 0/10 |
| Example 1-6 | 0/10 | 0/10 | 0/10 | 0/10 | 0/10 | 0/10 | 8/10 | 8/10 |

In the samples using the high-melting-point solder bumps, as shown in Tables 4 and 5, no electric connection failure was observed in the tested semiconductor devices produced with the underfills of Examples 1-1, 1-2, 1-3, 1-4, 1-5, and 1-6, In contrast, electric connection failure was observed in the tested semiconductor devices produced with the underfills of Comparative Examples 1-1 and 1-2.

In the cases of using the lead-free solder bumps, as shown in Tables 6 and 7, no electric connection failure was observed in the tested semiconductor devices produced with the underfills of Examples 1-1, 1-2, 1-4, 1-5, and 1-6.

In contrast, electric connection failure was observed in the tested semiconductor devices produced with the underfills of Example 1-3 and Comparative Examples 1-1 and 1-2.

The solder bump joints at which electric connection failure was observed were cut and the cross-section was observed. Cracks were observed in all solder bump joints having connection failure. These results show that high elastic modulus at the heated state during the thermal cycle test is essential for preventing occurrence of cracks at the lead-free solder or high-melting-point solder joints.

Next, the occurrence of cracks in the interlayer insulating film of the semiconductor element A of each semiconductor device to be tested after the thermal cycle test (1000 cycles at a cold state of −55° C. and a heated state of 125° C.) was observed. The semiconductor device to be tested after the thermal cycle test was cut to observe the occurrence of cracks in the interlayer insulating film of the semiconductor element A.

The results are shown in Table 8 to Table 11. Table 8 indicates the results of the semiconductor devices each of which has the buildup substrate provided with inner circuit layers (core layers) and the high-melting-point solder. Table 9 indicates the results of the semiconductor devices each of which has the core-less buildup substrate and the high-melting-point solder. Table 10 indicates the results of the semiconductor devices each of which has the buildup substrate provided with inner circuit layers (core layers) and the lead-free solder. Table 11 indicates the results of the semiconductor devices each of which has the core-less buildup substrate and the lead-free solder.

TABLE 8

| | Insulating layer of buildup substrate | | | | | | | |
|---|---|---|---|---|---|---|---|---|
| | Example 2-1 | Example 2-2 | Example 2-3 | Example 2-4 | Example 2-5 | Example 2-6 | Comparative Example 2-1 | Comparative Example 2-2 |
| Example 1-1 | 0/10 | 0/10 | 0/10 | 0/10 | 0/10 | 0/10 | 8/10 | 10/10 |
| Example 1-2 | 0/10 | 0/10 | 0/10 | 0/10 | 0/10 | 0/10 | 6/10 | 8/10 |
| Example 1-3 | 0/10 | 0/10 | 0/10 | 0/10 | 0/10 | 0/10 | 3/10 | 6/10 |
| Comparative Example 1-1 | 0/10 | 0/10 | 0/10 | 0/10 | 0/10 | 0/10 | 1/10 | 3/10 |
| Comparative Example 1-2 | 0/10 | 0/10 | 0/10 | 0/10 | 0/10 | 0/10 | 8/10 | 7/10 |
| Example 1-4 | 0/10 | 0/10 | 0/10 | 0/10 | 0/10 | 0/10 | 6/10 | 9/10 |
| Example 1-5 | 0/10 | 0/10 | 0/10 | 0/10 | 0/10 | 0/10 | 5/10 | 7/10 |
| Example 1-6 | 0/10 | 0/10 | 0/10 | 0/10 | 0/10 | 0/10 | 2/10 | 5/10 |

TABLE 9

| | Insulating layer of buildup substrate | | | | | | | |
|---|---|---|---|---|---|---|---|---|
| | Example 2-1 | Example 2-2 | Example 2-3 | Example 2-4 | Example 2-5 | Example 2-6 | Comparative Example 2-1 | Comparative Example 2-2 |
| Example 1-1 | 0/10 | 0/10 | 0/10 | 0/10 | 0/10 | 0/10 | 10/10 | 10/10 |
| Example 1-2 | 0/10 | 0/10 | 0/10 | 0/10 | 0/10 | 0/10 | 8/10 | 10/10 |
| Example 1-3 | 0/10 | 0/10 | 0/10 | 0/10 | 0/10 | 0/10 | 6/10 | 8/10 |
| Comparative Example 1-1 | 0/10 | 0/10 | 0/10 | 0/10 | 0/10 | 0/10 | 3/10 | 5/10 |
| Comparative Example 1-2 | 0/10 | 0/10 | 0/10 | 0/10 | 0/10 | 0/10 | 10/10 | 7/10 |
| Example 1-4 | 0/10 | 0/10 | 0/10 | 0/10 | 0/10 | 0/10 | 9/10 | 10/10 |
| Example 1-5 | 0/10 | 0/10 | 0/10 | 0/10 | 0/10 | 0/10 | 7/10 | 8/10 |
| Example 1-6 | 0/10 | 0/10 | 0/10 | 0/10 | 0/10 | 0/10 | 4/10 | 7/10 |

TABLE 10

| | Insulating layer of buildup substrate | | | | | | | |
|---|---|---|---|---|---|---|---|---|
| | Example 2-1 | Example 2-2 | Example 2-3 | Example 2-4 | Example 2-5 | Example 2-6 | Comparative Example 2-1 | Comparative Example 2-2 |
| Example 1-1 | 0/10 | 0/10 | 0/10 | 0/10 | 0/10 | 0/10 | 9/10 | 10/10 |
| Example 1-2 | 0/10 | 0/10 | 0/10 | 0/10 | 0/10 | 0/10 | 6/10 | 8/10 |
| Example 1-3 | 0/10 | 0/10 | 0/10 | 0/10 | 0/10 | 0/10 | 3/10 | 6/10 |
| Comparative Example 1-1 | 0/10 | 0/10 | 0/10 | 0/10 | 0/10 | 0/10 | 1/10 | 3/10 |
| Comparative Example 1-2 | 0/10 | 0/10 | 0/10 | 0/10 | 0/10 | 0/10 | 8/10 | 9/10 |
| Example 1-4 | 0/10 | 0/10 | 0/10 | 0/10 | 0/10 | 0/10 | 8/10 | 9/10 |
| Example 1-5 | 0/10 | 0/10 | 0/10 | 0/10 | 0/10 | 0/10 | 4/10 | 7/10 |
| Example 1-6 | 0/10 | 0/10 | 0/10 | 0/10 | 0/10 | 0/10 | 1/10 | 5/10 |

TABLE 11

| | Insulating layer of buildup substrate | | | | | | | |
|---|---|---|---|---|---|---|---|---|
| | Example 2-1 | Example 2-2 | Example 2-3 | Example 2-4 | Example 2-5 | Example 2-6 | Comparative Example 2-1 | Comparative Example 2-2 |
| Example 1-1 | 0/10 | 0/10 | 0/10 | 0/10 | 0/10 | 0/10 | 10/10 | 10/10 |
| Example 1-2 | 0/10 | 0/10 | 0/10 | 0/10 | 0/10 | 0/10 | 10/10 | 10/10 |
| Example 1-3 | 0/10 | 0/10 | 0/10 | 0/10 | 0/10 | 0/10 | 6/10 | 10/10 |
| Comparative Example 1-1 | 0/10 | 0/10 | 0/10 | 0/10 | 0/10 | 0/10 | 3/10 | 5/10 |
| Comparative Example 1-2 | 0/10 | 0/10 | 0/10 | 0/10 | 0/10 | 0/10 | 10/10 | 10/10 |
| Example 1-4 | 0/10 | 0/10 | 0/10 | 0/10 | 0/10 | 0/10 | 10/10 | 10/10 |
| Example 1-5 | 0/10 | 0/10 | 0/10 | 0/10 | 0/10 | 0/10 | 9/10 | 10/10 |
| Example 1-6 | 0/10 | 0/10 | 0/10 | 0/10 | 0/10 | 0/10 | 4/10 | 8/10 |

As shown in Tables 8 to 11, no crack was observed in the interlayer insulating film of each of the semiconductor device including the buildup substrate provided with inner circuit layers (core layers) and the core-less buildup substrate of Examples 2-1,2-2, 2-3,2-4, 2-5, and 2-6 after the thermal cycle test.

In contrast, cracks were observed in the interlayer insulating film of each of the semiconductor device to be tested including the buildup substrates provided with inner circuit layers (core layers) and the core-less buildup substrate of Comparative Examples 2-1 and 2-2.

These results show that use of a substrate including an insulating layer having low linear expansion coefficient is essential for preventing occurrence of cracks in the interlayer insulating film of the semiconductor element.

<Preparation and Evaluation (2) of Semiconductor Device>

Semiconductor devices to be tested were prepared as in <Preparation and evaluation (1) of semiconductor device> except that the semiconductor element B was used in place of the semiconductor element A. The interlayer insulating film of the semiconductor element B was composed of $SiO_2$, and the semiconductor element B did not have a low dielectric layer having a relative permittivity of 3.3 or less. The semiconductor chip B was a thin chip having a thickness of 100 μm.

Next, the resulting semiconductor devices to be tested were subjected to a thermal cycle test (1000 cycles at a cold state of −55° C. and a heated state of 125° C.).

And then, cracks in the semiconductor element B were evaluated. The results are shown in Table 12 to Table 15.

TABLE 12

| | Insulating layer of buildup substrate | | | | | | | |
|---|---|---|---|---|---|---|---|---|
| | Example 2-1 | Example 2-2 | Example 2-3 | Example 2-4 | Example 2-5 | Example 2-6 | Comparative Example 2-1 | Comparative Example 2-2 |
| Example 1-1 | 0/10 | 0/10 | 0/10 | 0/10 | 0/10 | 0/10 | 6/10 | 7/10 |
| Example 1-2 | 0/10 | 0/10 | 0/10 | 0/10 | 0/10 | 0/10 | 5/10 | 5/10 |
| Example 1-3 | 0/10 | 0/10 | 0/10 | 0/10 | 0/10 | 0/10 | 2/10 | 4/10 |
| Comparative Example 1-1 | 0/10 | 0/10 | 0/10 | 0/10 | 0/10 | 0/10 | 1/10 | 1/10 |
| Comparative Example 1-2 | 0/10 | 0/10 | 0/10 | 0/10 | 0/10 | 0/10 | 5/10 | 6/10 |
| Example 1-4 | 0/10 | 0/10 | 0/10 | 0/10 | 0/10 | 0/10 | 4/10 | 6/10 |
| Example 1-5 | 0/10 | 0/10 | 0/10 | 0/10 | 0/10 | 0/10 | 4/10 | 5/10 |
| Example 1-6 | 0/10 | 0/10 | 0/10 | 0/10 | 0/10 | 0/10 | 1/10 | 2/10 |

TABLE 13

| | Insulating layer of buildup substrate | | | | | | | |
|---|---|---|---|---|---|---|---|---|
| | Example 2-1 | Example 2-2 | Example 2-3 | Example 2-4 | Example 2-5 | Example 2-6 | Comparative Example 2-1 | Comparative Example 2-2 |
| Example 1-1 | 0/10 | 0/10 | 0/10 | 0/10 | 0/10 | 0/10 | 9/10 | 9/10 |
| Example 1-2 | 0/10 | 0/10 | 0/10 | 0/10 | 0/10 | 0/10 | 8/10 | 7/10 |
| Example 1-3 | 0/10 | 0/10 | 0/10 | 0/10 | 0/10 | 0/10 | 6/10 | 6/10 |
| Comparative Example 1-1 | 0/10 | 0/10 | 0/10 | 0/10 | 0/10 | 0/10 | 1/10 | 3/10 |
| Comparative Example 1-2 | 0/10 | 0/10 | 0/10 | 0/10 | 0/10 | 0/10 | 9/10 | 9/10 |
| Example 1-4 | 0/10 | 0/10 | 0/10 | 0/10 | 0/10 | 0/10 | 7/10 | 9/10 |
| Example 1-5 | 0/10 | 0/10 | 0/10 | 0/10 | 0/10 | 0/10 | 6/10 | 6/10 |
| Example 1-6 | 0/10 | 0/10 | 0/10 | 0/10 | 0/10 | 0/10 | 4/10 | 5/10 |

TABLE 14

| | Insulating layer of buildup substrate | | | | | | | |
|---|---|---|---|---|---|---|---|---|
| | Example 2-1 | Example 2-2 | Example 2-3 | Example 2-4 | Example 2-5 | Example 2-6 | Comparative Example 2-1 | Comparative Example 2-2 |
| Example 1-1 | 0/10 | 0/10 | 0/10 | 0/10 | 0/10 | 0/10 | 9/10 | 8/10 |
| Example 1-2 | 0/10 | 0/10 | 0/10 | 0/10 | 0/10 | 0/10 | 6/10 | 5/10 |
| Example 1-3 | 0/10 | 0/10 | 0/10 | 0/10 | 0/10 | 0/10 | 3/10 | 6/10 |
| Comparative Example 1-1 | 0/10 | 0/10 | 0/10 | 0/10 | 0/10 | 0/10 | 1/10 | 3/10 |
| Comparative Example 1-2 | 0/10 | 0/10 | 0/10 | 0/10 | 0/10 | 0/10 | 8/10 | 6/10 |
| Example 1-4 | 0/10 | 0/10 | 0/10 | 0/10 | 0/10 | 0/10 | 7/10 | 7/10 |
| Example 1-5 | 0/10 | 0/10 | 0/10 | 0/10 | 0/10 | 0/10 | 5/10 | 6/10 |
| Example 1-6 | 0/10 | 0/10 | 0/10 | 0/10 | 0/10 | 0/10 | 2/10 | 4/10 |

TABLE 15

| | Insulating layer of buildup substrate | | | | | | | |
|---|---|---|---|---|---|---|---|---|
| | Example 2-1 | Example 2-2 | Example 2-3 | Example 2-4 | Example 2-5 | Example 2-6 | Comparative Example 2-1 | Comparative Example 2-2 |
| Example 1-1 | 0/10 | 0/10 | 0/10 | 0/10 | 0/10 | 0/10 | 10/10 | 10/10 |
| Example 1-2 | 0/10 | 0/10 | 0/10 | 0/10 | 0/10 | 0/10 | 9/10 | 10/10 |
| Example 1-3 | 0/10 | 0/10 | 0/10 | 0/10 | 0/10 | 0/10 | 6/10 | 10/10 |
| Comparative Example 1-1 | 0/10 | 0/10 | 0/10 | 0/10 | 0/10 | 0/10 | 2/10 | 2/10 |
| Comparative Example 1-2 | 0/10 | 0/10 | 0/10 | 0/10 | 0/10 | 0/10 | 10/10 | 9/10 |
| Example 1-4 | 0/10 | 0/10 | 0/10 | 0/10 | 0/10 | 0/10 | 9/10 | 10/10 |
| Example 1-5 | 0/10 | 0/10 | 0/10 | 0/10 | 0/10 | 0/10 | 7/10 | 7/10 |
| Example 1-6 | 0/10 | 0/10 | 0/10 | 0/10 | 0/10 | 0/10 | 5/10 | 8/10 |

As shown in Table 12 to Table 15, no crack was observed in the semiconductor devices to be tested including the buildup substrate provided with inner circuit layers (core layers) or the core-less buildup substrate of Examples 2-1,2-2, 2-3,2-4, 2-5, and 2-6, after the thermal cycle test.

In contrast, cracks were observed in the semiconductor devices to be tested including the buildup substrate provided with inner circuit layers (core layers) or the core-less buildup substrate of Comparative Examples 2-1 and 2-2.

These results show that use of a substrate including an insulating layer having low linear expansion coefficient is essential for preventing occurrence of cracks in the semiconductor element.

The invention claimed is:

1. A semiconductor device comprising:
   a substrate;
   a semiconductor element mounted on the substrate;
   a bump connecting the substrate and the semiconductor element; and
   an underfill filling in around the bump, wherein
   the bump comprises a high-melting-point solder, the high melting point solder having a melting point of 230° C. or more,
   the underfill comprises a resin material, the resin material having an elastic modulus in the range of 30 MPa to 510 MPa,
   the substrate has a buildup layer which includes resin-containing insulating layers and conductive interconnection layers, with the insulating layers and conductive interconnection layers being alternately laminated, and each of the conductive interconnection layers being connected by conductive layers, the conductive layers being formed in via holes, the via holes being formed in the insulating layers,
   a linear expansion coefficient of at least one of the resin-containing insulating layers of the buildup layer in an in-plane direction of the substrate at temperatures between 25° C. and the glass transition temperature of the at least one insulating layer is 35 ppm/° C. or less, and
   the difference in linear expansion coefficient between the underfill and the bump at temperatures between 25° C. and the glass transition temperature of the at least one insulating layer is 10 ppm/° C. or less.

2. The semiconductor device according to claim 1, wherein the semiconductor element comprises a silicon substrate; an interlayer insulating film provided on the silicon substrate, the interlayer insulating film comprising a low-dielectric layer having a relative permittivity of 3.3 or less; and a lead provided in the interlayer insulating film.

3. The semiconductor device according to claim 2, wherein the difference in linear expansion coefficient between the underfill and the at least one insulating layer of the buildup layer at temperatures between 25° C. and the glass transition temperature of the at least one insulating layer is 25 ppm/° C. or less.

4. The semiconductor device according to claim 1, wherein the difference in linear expansion coefficient between the underfill and the at least one insulating layer of the buildup layer at temperatures between 25° C. and the glass transition temperature of the at least one insulating layer is 25 ppm/° C. or less.

5. The semiconductor device according to claim 1, wherein the substrate has a core layer having another insulating layer in which a through hole is formed, and
   a conductive layer which is provided inside said through hole, and wherein
   said conductive layer is connected to one of the conductive interconnection layers of the buildup layer.

6. The semiconductor device according to claim 1, wherein the resin of the at least one insulating layer of the buildup layer comprises a cyanate resin.

7. The semiconductor device according to claim 6, wherein the cyanate resin is a novolak cyanate resin.

8. A semiconductor device comprising:
   a substrate;
   a semiconductor element mounted on the substrate;
   a bump connecting the substrate and the semiconductor element; and
   an underfill filling in around the bump, wherein
   the bump comprises a lead-free solder,
   the underfill comprises a resin material, the resin material having an elastic modulus in the range of 150 MPa to 800 MPa,
   the substrate has a buildup layer which includes resin-containing insulating layers and conductive interconnection layers, with the insulating layers and conductive interconnection layers being alternately laminated, and the conductive interconnection layers being connected by conductive layers, the conductive layers being formed in via holes, the via holes being formed in the insulating layers,
   a linear expansion coefficient of at least one of the resin-containing insulating layers of the buildup layer in an in-plane direction of the substrate at temperatures between 25° C. and the glass transition temperature of the at least one insulating layer is 35 ppm/° C. or less the difference in linear expansion coefficient between the underfill and the bump at temperatures between 25° C. and the glass transition temperature of the at least one insulating layer is 10 ppm/° C. or less.

9. The semiconductor device according to claim 8, wherein the semiconductor element comprises a silicon substrate; an interlayer insulating film provided on the silicon substrate, the interlayer insulating film comprising a low-dielectric layer having a relative permittivity of 3.3 or less; and a lead provided in the interlayer insulating film.

10. The semiconductor device according to claim 9, wherein the difference in linear expansion coefficient between the underfill and the at least one insulating layer of the buildup layer at temperatures between 25° C. and the glass transition temperature of the at least one insulating layer is 25 ppm/° C. or less.

11. The semiconductor device according to claim 8, wherein the difference in linear expansion coefficient between the underfill and the at least one insulating layer of the buildup layer at temperatures between 25° C. and the glass transition temperature of the at least one insulating layer is 25 ppm/° C. or less.

12. The semiconductor device according to claim 8, wherein the substrate has a core layer having another insulating layer in which a through hole is formed, and
   a conductive layer which is provided inside said through hole, and wherein
   said conductive layer is connected to one of the conductive interconnection layers of the buildup layer.

13. The semiconductor device according to claim 8, wherein the resin of the at least one insulating layer of the buildup layer comprises a cyanate resin.

14. The semiconductor device according to claim 13, wherein the cyanate resin is a novolak cyanate resin.

* * * * *